United States Patent
Hjerrild et al.

(10) Patent No.: US 12,470,170 B2
(45) Date of Patent: Nov. 11, 2025

(54) INTEGRATED CELL AND CIRCUIT INTERCONNECTION

(71) Applicant: GAF Energy LLC, Parsippany, NJ (US)

(72) Inventors: Natasha Hjerrild, Berkeley, CA (US); David Kavulak, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/605,498

(22) Filed: Mar. 14, 2024

(65) Prior Publication Data
US 2024/0313701 A1  Sep. 19, 2024

Related U.S. Application Data

(60) Provisional application No. 63/490,145, filed on Mar. 14, 2023.

(51) Int. Cl.
*H02S 40/36*  (2014.01)
*H02S 20/23*  (2014.01)
(Continued)

(52) U.S. Cl.
CPC .............. *H02S 40/36* (2014.12); *H02S 20/23* (2014.12); *H10F 19/70* (2025.01); *H10F 19/906* (2025.01)

(58) Field of Classification Search
CPC ............ H01L 31/0512; H01L 31/0508; H01L 31/0504; H01L 31/05; H02S 40/36;
(Continued)

(56) References Cited

U.S. PATENT DOCUMENTS 1,981,467 A  11/1934  Radtke
3,156,497 A  11/1964  Lessard
(Continued)

FOREIGN PATENT DOCUMENTS

CA  2829440 A  5/2019
CH  700095 A2  6/2010
(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.
(Continued)

*Primary Examiner* — Andrew J Golden
(74) *Attorney, Agent, or Firm* — GREENBERG TRAURIG, LLP

(57) ABSTRACT

An integrated cell and circuit interconnection for photovoltaic devices is disclosed. Interconnection componentry includes conductive material utilized to connect a negative terminal of a photovoltaic cell of a substring of a photovoltaic device to a positive terminal of a photovoltaic cell of another substring of the photovoltaic device to electrically connect the cells together. Certain interconnection componentry include extension portions that extend beyond the edge of the photovoltaic cells to which the interconnection componentry are connected. The extension portions are configured to connect to an electrical circuit of the photovoltaic device and connect the substrings to which the extension portions are attached to other substrings of the photovoltaic device. The interconnection componentry and extension portions facilitate bypass diode integration into the electrical circuit, while optimizing shade tolerance of the
(Continued)

photovoltaic device and increasing roof fill with regard to a roof on which the photovoltaic device is secured.

17 Claims, 29 Drawing Sheets

(51) Int. Cl.
*H10F 19/70* (2025.01)
*H10F 19/90* (2025.01)

(58) Field of Classification Search
CPC ........ H02S 20/23; H10F 19/906; H10F 19/70; H10F 19/00; H10F 19/902; H10F 77/937
See application file for complete search history.

(56) References Cited

U.S. PATENT DOCUMENTS

| | | |
|---|---|---|
| 3,581,779 A | 6/1971 | Gilbert, Jr. |
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,308,482 B1 | 10/2001 | Strait |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,579,028 B1 | 3/2020 | Jacob |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |

(56) References Cited

U.S. PATENT DOCUMENTS

| | | | |
|---|---|---|---|
| 11,486,144 B2 | 11/2022 | Bunea et al. | |
| 11,489,482 B2 | 11/2022 | Peterson et al. | |
| 11,496,088 B2 | 11/2022 | Sirski et al. | |
| 11,508,861 B1 | 11/2022 | Perkins et al. | |
| 11,512,480 B1 | 11/2022 | Achor et al. | |
| 11,527,665 B2 | 12/2022 | Boitnott | |
| 11,545,927 B2 | 1/2023 | Abra et al. | |
| 11,545,928 B2 | 1/2023 | Perkins et al. | |
| 11,658,470 B2 | 5/2023 | Nguyen et al. | |
| 11,661,745 B2 | 5/2023 | Bunea et al. | |
| 11,689,149 B2 | 6/2023 | Clemente et al. | |
| 11,705,531 B2 | 7/2023 | Sharenko et al. | |
| 11,728,759 B2 | 8/2023 | Nguyen et al. | |
| 11,732,490 B2 | 8/2023 | Achor et al. | |
| 11,811,361 B1 | 11/2023 | Farhangi et al. | |
| 11,824,486 B2 | 11/2023 | Nguyen et al. | |
| 11,824,487 B2 | 11/2023 | Nguyen et al. | |
| 11,843,067 B2 | 12/2023 | Nguyen et al. | |
| 2002/0053360 A1 | 5/2002 | Kinoshita et al. | |
| 2002/0129849 A1 | 9/2002 | Heckeroth | |
| 2003/0029494 A1* | 2/2003 | Ohkubo | H01L 31/0508 |
| | | | 136/255 |
| 2003/0101662 A1 | 6/2003 | Ullman | |
| 2003/0132265 A1 | 7/2003 | Villela et al. | |
| 2003/0217768 A1 | 11/2003 | Guha | |
| 2004/0000334 A1 | 1/2004 | Ressler | |
| 2005/0030187 A1 | 2/2005 | Peress et al. | |
| 2005/0115603 A1 | 6/2005 | Yoshida et al. | |
| 2005/0144870 A1 | 7/2005 | Dinwoodie | |
| 2005/0178428 A1 | 8/2005 | Laaly et al. | |
| 2005/0193673 A1 | 9/2005 | Rodrigues et al. | |
| 2006/0042683 A1 | 3/2006 | Gangemi | |
| 2006/0046084 A1 | 3/2006 | Yang et al. | |
| 2007/0074757 A1 | 4/2007 | Mellott et al. | |
| 2007/0181174 A1 | 8/2007 | Ressler | |
| 2007/0193618 A1 | 8/2007 | Bressler et al. | |
| 2007/0249194 A1 | 10/2007 | Liao | |
| 2007/0295385 A1 | 12/2007 | Sheats et al. | |
| 2008/0006323 A1 | 1/2008 | Kalkanoglu et al. | |
| 2008/0035140 A1 | 2/2008 | Placer et al. | |
| 2008/0078440 A1 | 4/2008 | Lim et al. | |
| 2008/0185748 A1 | 8/2008 | Kalkanoglu | |
| 2008/0271774 A1 | 11/2008 | Kalkanoglu et al. | |
| 2008/0302030 A1 | 12/2008 | Stancel et al. | |
| 2008/0315061 A1 | 12/2008 | Fath | |
| 2009/0000222 A1 | 1/2009 | Kalkanoglu et al. | |
| 2009/0014057 A1 | 1/2009 | Croft et al. | |
| 2009/0014058 A1 | 1/2009 | Croft et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2009/0275247 A1 | 11/2009 | Richter et al. | |
| 2010/0019580 A1 | 1/2010 | Croft et al. | |
| 2010/0095618 A1 | 4/2010 | Edison et al. | |
| 2010/0101634 A1 | 4/2010 | Frank et al. | |
| 2010/0116325 A1 | 5/2010 | Nikoonahad | |
| 2010/0131108 A1 | 5/2010 | Meyer | |
| 2010/0139184 A1 | 6/2010 | Williams et al. | |
| 2010/0146878 A1 | 6/2010 | Koch et al. | |
| 2010/0159221 A1 | 6/2010 | Kourtakis et al. | |
| 2010/0170169 A1 | 7/2010 | Railkar et al. | |
| 2010/0186798 A1 | 7/2010 | Tormen et al. | |
| 2010/0242381 A1 | 9/2010 | Jenkins | |
| 2010/0313499 A1 | 12/2010 | Gangemi | |
| 2010/0325976 A1 | 12/2010 | DeGenfelder et al. | |
| 2010/0326488 A1 | 12/2010 | Aue et al. | |
| 2010/0326501 A1 | 12/2010 | Zhao et al. | |
| 2011/0030761 A1 | 2/2011 | Kalkanoglu et al. | |
| 2011/0036386 A1 | 2/2011 | Browder | |
| 2011/0036389 A1 | 2/2011 | Hardikar et al. | |
| 2011/0048507 A1 | 3/2011 | Livsey et al. | |
| 2011/0058337 A1 | 3/2011 | Han et al. | |
| 2011/0061326 A1 | 3/2011 | Jenkins | |
| 2011/0100436 A1 | 5/2011 | Cleereman et al. | |
| 2011/0104488 A1 | 5/2011 | Muessig et al. | |
| 2011/0132427 A1 | 6/2011 | Kalkanoglu et al. | |
| 2011/0168238 A1 | 7/2011 | Metin et al. | |
| 2011/0239555 A1 | 10/2011 | Cook et al. | |
| 2011/0302859 A1 | 12/2011 | Crasnianski | |
| 2011/0314753 A1 | 12/2011 | Farmer et al. | |
| 2012/0034799 A1 | 2/2012 | Hunt | |
| 2012/0060434 A1 | 3/2012 | Jacobs | |
| 2012/0060902 A1 | 3/2012 | Drake | |
| 2012/0085392 A1 | 4/2012 | Albert et al. | |
| 2012/0137600 A1 | 6/2012 | Jenkins | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2012/0266942 A1 | 10/2012 | Komatsu et al. | |
| 2012/0279150 A1 | 11/2012 | Pislkak et al. | |
| 2012/0282437 A1 | 11/2012 | Clark et al. | |
| 2012/0291848 A1 | 11/2012 | Sherman et al. | |
| 2012/0318319 A1* | 12/2012 | Pinarbasi | H01L 31/0504 |
| | | | 257/E33.001 |
| 2013/0008499 A1 | 1/2013 | Verger et al. | |
| 2013/0014455 A1 | 1/2013 | Grieco | |
| 2013/0118558 A1 | 5/2013 | Sherman | |
| 2013/0193769 A1 | 8/2013 | Mehta et al. | |
| 2013/0247988 A1 | 9/2013 | Reese et al. | |
| 2013/0284267 A1 | 10/2013 | Plug et al. | |
| 2013/0306137 A1 | 11/2013 | Ko | |
| 2014/0090697 A1 | 4/2014 | Rodrigues et al. | |
| 2014/0150843 A1 | 6/2014 | Pearce et al. | |
| 2014/0173997 A1 | 6/2014 | Jenkins | |
| 2014/0179220 A1 | 6/2014 | Railkar et al. | |
| 2014/0182222 A1 | 7/2014 | Kalkanoglu et al. | |
| 2014/0208675 A1 | 7/2014 | Beerer et al. | |
| 2014/0254776 A1 | 9/2014 | O'Connor et al. | |
| 2014/0266289 A1 | 9/2014 | Della Sera et al. | |
| 2014/0311556 A1 | 10/2014 | Feng et al. | |
| 2014/0352760 A1 | 12/2014 | Haynes et al. | |
| 2014/0366464 A1 | 12/2014 | Rodrigues et al. | |
| 2015/0089895 A1 | 4/2015 | Leitch | |
| 2015/0162459 A1 | 6/2015 | Lu et al. | |
| 2015/0340516 A1 | 11/2015 | Kim et al. | |
| 2015/0349173 A1 | 12/2015 | Morad et al. | |
| 2016/0105144 A1 | 4/2016 | Haynes et al. | |
| 2016/0142008 A1 | 5/2016 | Lopez et al. | |
| 2016/0254776 A1 | 9/2016 | Rodrigues et al. | |
| 2016/0276508 A1 | 9/2016 | Huang et al. | |
| 2016/0359451 A1 | 12/2016 | Mao et al. | |
| 2017/0159292 A1 | 6/2017 | Chihlas et al. | |
| 2017/0179319 A1 | 6/2017 | Yamashita et al. | |
| 2017/0179726 A1 | 6/2017 | Garrity et al. | |
| 2017/0237390 A1 | 8/2017 | Hudson et al. | |
| 2017/0331415 A1 | 11/2017 | Koppi et al. | |
| 2017/0359609 A1* | 12/2017 | Caswell | H10F 19/70 |
| 2018/0094438 A1 | 4/2018 | Wu et al. | |
| 2018/0097472 A1 | 4/2018 | Anderson et al. | |
| 2018/0115275 A1 | 4/2018 | Flanigan et al. | |
| 2018/0254738 A1 | 9/2018 | Yang et al. | |
| 2018/0294765 A1 | 10/2018 | Friedrich et al. | |
| 2018/0351502 A1 | 12/2018 | Almy et al. | |
| 2018/0367089 A1 | 12/2018 | Stutterheim et al. | |
| 2019/0030867 A1 | 1/2019 | Sun et al. | |
| 2019/0081081 A1* | 3/2019 | Morad | H01L 31/0508 |
| 2019/0081436 A1 | 3/2019 | Onodi et al. | |
| 2019/0123679 A1 | 4/2019 | Rodrigues et al. | |
| 2019/0253022 A1 | 8/2019 | Hardar et al. | |
| 2019/0267931 A1* | 8/2019 | Yang | H02S 30/10 |
| 2019/0280301 A1* | 9/2019 | Lee | H01L 31/044 |
| 2019/0305717 A1 | 10/2019 | Allen et al. | |
| 2019/0319151 A1* | 10/2019 | Caswell | H01L 31/02008 |
| 2020/0109320 A1 | 4/2020 | Jiang | |
| 2020/0144958 A1 | 5/2020 | Rodrigues et al. | |
| 2020/0220819 A1 | 7/2020 | Vu et al. | |
| 2020/0224419 A1 | 7/2020 | Boss et al. | |
| 2020/0343397 A1 | 10/2020 | Hem-Jensen | |

(56) References Cited

U.S. PATENT DOCUMENTS

| | | | |
|---|---|---|---|
| 2021/0083619 A1 | 3/2021 | Hegedus | |
| 2021/0115223 A1 | 4/2021 | Bonekamp et al. | |
| 2021/0159353 A1 | 5/2021 | Li et al. | |
| 2021/0281215 A1* | 9/2021 | Lin | H01L 31/0516 |
| 2021/0301536 A1 | 9/2021 | Baggs et al. | |
| 2021/0343886 A1 | 11/2021 | Sharenko et al. | |
| 2022/0149213 A1 | 5/2022 | Mensink et al. | |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-1348283 B1 | 1/2014 |
| KR | 10-2019-0000367 A | 1/2019 |
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5KW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing <<https://www.owenscorning.com/en-us/roofing/tools/how-roofing-underlayment-helps-protect-your-home>> retrieved Nov. 1, 2021.

* cited by examiner

INTEGRATED CELL AND CIRCUIT INTERCONNECTION

CROSS-REFERENCE TO RELATED APPLICATIONS

The present application claims priority to and the benefit of U.S. Provisional Patent Application No. 63/490,145, filed on Mar. 14, 2023, the entirety of which is hereby incorporated by reference.

FIELD OF THE INVENTION

The present application relates to photovoltaic modules, circuit interconnection technologies, roofing accessories and technologies, and, more particularly, to an integrated cell and circuit interconnection, such as for use with photovoltaic modules.

BACKGROUND

Photovoltaic modules are utilized on roofing of structures to absorb sunlight to generate energy that may be converted for use on an electrical grid.

SUMMARY

In certain embodiments, a system including a plurality of photovoltaic modules installed on a roof deck of a structure is provided. In certain embodiments, one or more of the photovoltaic modules may include an electrical circuit that supplies power to the photovoltaic modules and delivers power generated by the photovoltaic modules. In certain embodiments, the one or more photovoltaic modules may include a plurality of photovoltaic substrings including a plurality of photovoltaic cells. In certain embodiments, the one or more photovoltaic modules may include at least one cell interconnection component including conductive material, such as, but not limited to, aluminum-based foil. In certain embodiments, the at least one cell interconnection component is connected to a negative terminal of a first photovoltaic cell of a first substring of the plurality of photovoltaic substrings to a positive terminal of a second photovoltaic cell of a second substring of the plurality of photovoltaic substrings to electrically connect the first and second photovoltaic cells. In certain embodiments, an extension portion of the at least one cell interconnection component may extend beyond a first edge of the first photovoltaic cell of the first substring, a second edge of the second photovoltaic cell of the second substring, or a combination thereof. In certain embodiments, the extension portion is connected to at least one other substring of the plurality of photovoltaic substrings to electrically connect the first substring, the second substring, and the at least one other substring to the electrical circuit.

In certain embodiments, the system may include one or more bypass diodes, which, when triggered based on the presence of a condition, may bypass photovoltaic cells or substrings to which they are electrically connected. In certain embodiments, for example, the bypass diode may bypass only the first substring of the plurality of photovoltaic substrings in response to detection of a condition affecting the first substring of the plurality of photovoltaic substrings. In certain embodiments, the system may further include an end substring of the plurality of photovoltaic substrings that is located at an end of the photovoltaic module. In certain embodiments, the end substring may include a single photovoltaic cell and a bypass diode that bypasses only the single photovoltaic cell of the end substring upon detection of a condition affecting the end substring. In certain embodiments, the conductive material of the at least one cell interconnection component may include laser-welded aluminum foil. In certain embodiments, the at least one cell interconnection component may include an aluminum-aluminum weld, rear laser metal bond, an aluminum-gold weld, a front laser metal bond, or a combination thereof.

In certain embodiments, each substring of the plurality of photovoltaic substrings may be connected to at least one other substring of the plurality of photovoltaic substrings via the at least one cell interconnection component. In certain embodiments, a cell interconnection component of the at least one cell interconnection component containing the extension portion may be located at every nth photovoltaic cell of the plurality of photovoltaic cells of the plurality of photovoltaic substrings. In certain embodiments, a set of the plurality of photovoltaic cells may be connected in parallel via the at least one cell interconnection component. In certain embodiments, the first photovoltaic cell and the second photovoltaic cell may be connected in series via the at least one cell interconnection component. In certain embodiments, the electrical circuit may include a bypass diode, an optimizer, a junction box, any other componentry, or a combination thereof.

In certain embodiments, the system can further include a first layer and a second layer. In certain embodiments, the first layer may be a lowermost layer of a photovoltaic module and the second layer may include the photovoltaic substrings including the plurality of photovoltaic cells, the one or more cell interconnection components, or a combination thereof. In certain embodiments, the one or more photovoltaic modules may be installed on a roof deck of a structure. In certain embodiments, at least a portion of the plurality of photovoltaic cells may be separated into a plurality of sub-cells. In certain embodiments, the portion of the plurality of photovoltaic cells separated into the plurality of sub-cells can provide a designated shade tolerance for the one or more photovoltaic modules.

In certain embodiments, a photovoltaic module including an electrical circuit, a plurality of photovoltaic substrings comprising a plurality of photovoltaic cells, and one or more cell interconnection components comprising conductive material. In certain embodiments, the one or more cell interconnection components may connect a negative terminal of a first photovoltaic cell of a first substring of the plurality of photovoltaic substrings to a positive terminal of a second photovoltaic cell of a second substring of the plurality of photovoltaic substrings to electrically connect the first and second photovoltaic cells. In certain embodiments, an extension portion of the one or more cell interconnection components may extend beyond a first edge of the first photovoltaic cell of the first substring, a second edge of the second photovoltaic cell of the second substring, or a combination thereof. In certain embodiments, the extension portion may connect to at least one other substring of the plurality of photovoltaic substrings to electrically connect the first substring, the second substring, and the at least one other substring to the electrical circuit. In certain embodiments, the extension portion may be soldered to the electrical circuit to electrically connect the extension portion to the electrical circuit, the first substring, the second substring, the at least one other substring, or a combination thereof.

In certain embodiments, a method for utilizing photovoltaic devices including cell interconnection componentry is provided. In certain embodiments, the method may include obtaining a plurality of photovoltaic modules. In certain embodiments, each of the photovoltaic modules can include an electrical circuit, a plurality of photovoltaic substrings comprising a plurality of photovoltaic cells, one or more cell interconnection components including an extension portion, and one or more bypass diodes. In certain embodiments, the one or more interconnection components are connected to a negative terminal of a first photovoltaic cell of a first substring of the plurality of photovoltaic substrings and to a positive terminal of a second photovoltaic cell of a second substring of the plurality of photovoltaic substrings to electrically connect the first and second photovoltaic cells. In certain embodiments, the extension portion of the one or more cell interconnection components extends beyond a first edge of the first photovoltaic cell of the first substring, a second edge of the second photovoltaic cell of the second substring, or a combination thereof. In certain embodiments, the extension portion may be connected to one or more other substrings of the plurality of photovoltaic substrings to electrically connect the first substring, the second substring, and the at least one other substring to the electrical circuit. In certain embodiments, the method may include installing the plurality of photovoltaic modules on a roof deck. In certain embodiments, the method can include monitoring the plurality of photovoltaic modules installed on the roof deck for presence of a condition affecting one or more photovoltaic substrings of a plurality of photovoltaic substrings of one or more photovoltaic modules of the plurality of photovoltaic modules. In certain embodiments, the method may include triggering, upon detection of the presence of the condition affecting the at least one photovoltaic substring, operation of the one or more bypass diodes to cause the one or more bypass diodes to bypass the one or more photovoltaic substrings of the plurality of photovoltaic substrings affected by the presence of the condition. In certain embodiments, the method may include continuing operation of remaining photovoltaic substrings of the plurality of photovoltaic substrings of the photovoltaic module.

In certain embodiments, the method may include ceasing operation of the at least one bypass diode upon detection that the condition affecting the at least one photovoltaic substring no longer exists. In certain embodiments, the method may further include stacking a first portion of the first photovoltaic cell onto a second portion of the second photovoltaic cell. In certain embodiments, the at least one cell interconnection component may be located where the first portion is stacked onto the second portion.

DETAILED DESCRIPTION

Photovoltaic shingles, modules, apparatuses, and systems incorporating integrated cell and circuitry interconnection componentry to enhance performance, versatility, roof fill capabilities, and shade tolerances are disclosed herein. Additionally, in certain embodiments, methods for utilizing photovoltaic shingles, modules, and systems that incorporate the integrated cell and circuitry interconnection componentry of the present disclosure enable efficient bypassing of photovoltaic substrings and cells when artifacts or objects cast shade or cover the shingles modules, and systems. In certain embodiments, the integrated cell and circuitry interconnection componentry amplifies and increases the interconnection of positive and negative terminals of neighboring photovoltaic cells in a photovoltaic shingle, module, or system. In certain embodiments, the integrated cell and circuitry interconnection componentry enables easy interconnection of any number of photovoltaic cells with an electrical circuit supporting the functionality of the photovoltaic shingle, module, or system. The integrated cell and circuitry interconnection componentry further facilitates the incorporation of in-laminate electronics into the photovoltaic shingles, modules, and systems. Such in-laminate electronics may include, but are not limited to, bypass diodes, optimizers, junction boxes, any other electronics or componentry, or a combination thereof.

In certain existing photovoltaic circuit designs, the electrical circuit utilized in a photovoltaic module may be divided into two substrings, with each substring containing a bypass diode configured in parallel. The bypass diodes may be utilized to ensure that the photovoltaic cells of the substrings maintain a temperature below the melting point of the backsheet material utilized on a roof deck or structure to avoid fires and damage to the structure to which the photovoltaic module is secured. In such designs, a bus ribbon may be soldered in between the two substrings to allow soldering of the bypass diodes in parallel to each substring. While utilizing a bus ribbon has the useful purpose in joining the substrings together, the bus ribbon increases the inactive area of the photovoltaic module because of the space that the bus ribbon occupies. The bus ribbon, for example causes a large gap between photovoltaic cells, which could instead be utilized for photovoltaic cells or other componentry.

Figure 27:
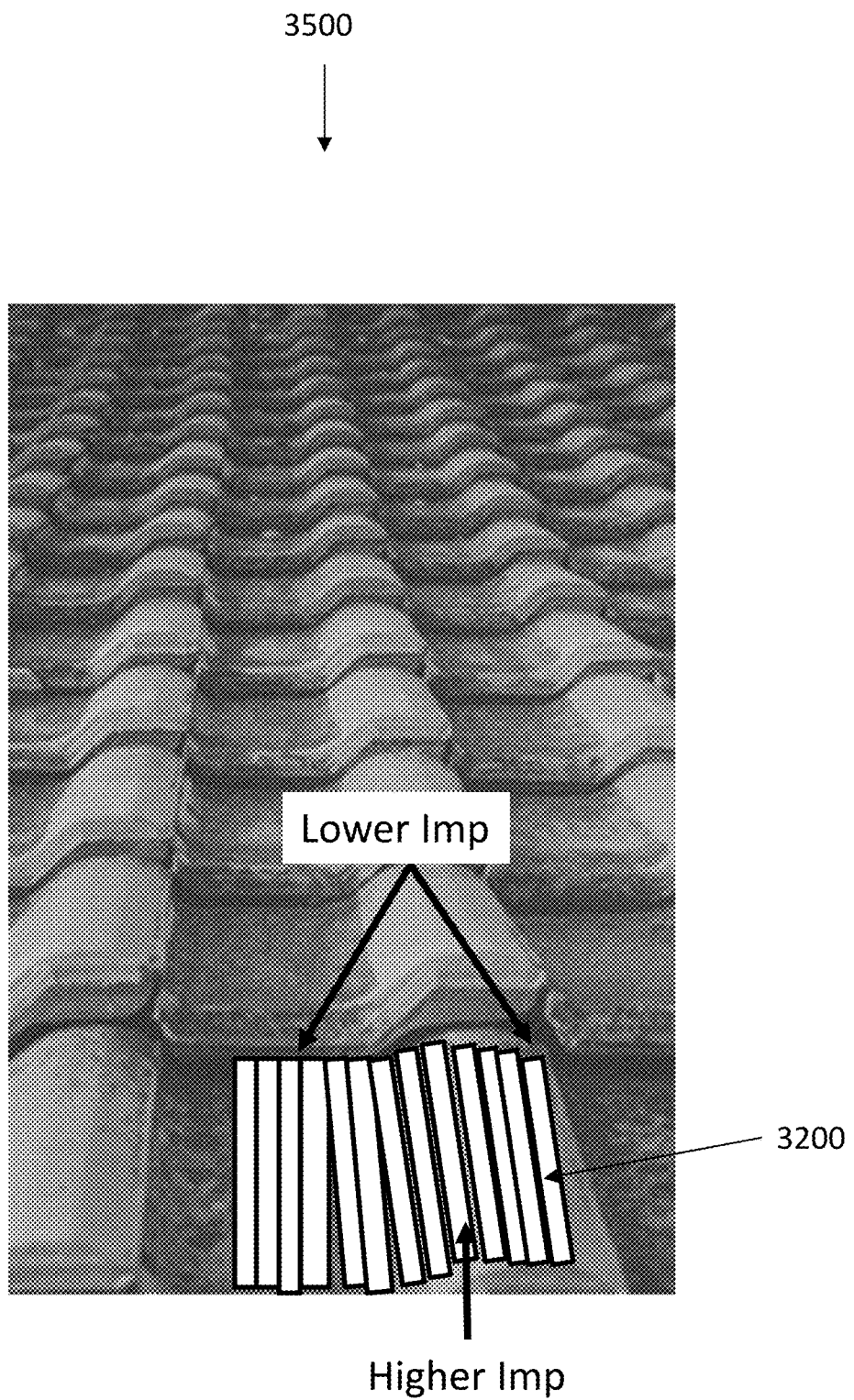
FIG. 27 illustrates an exemplary set of photovoltaic substrings connected in parallel that are positioned on a non-planar curved roof surface according to embodiments of the present disclosure.

Additionally, the left and right sides of the glass edge of the photovoltaic modules allow for wireway shading, such as caused by a wireway that may be housing wires or other componentry of a photovoltaic module casting a shadow or covering the left and right sides. Furthermore, there is significant complexity in manufacturing such existing photovoltaic circuit designs (e.g., as shown in FIG. 27). For example, additional copper ribbon is utilized and additional solder joints to interconnect cell interconnection wire and the bus ribbon is often required. In certain instances, the bus ribbon often needs to be bent or folded into a certain shape (e.g., L shape) and positioned into the electrical circuit, which further adds to the complexity of the design. The foregoing features of existing photovoltaic circuit designs may have lower power density than desired, which lend themselves to being less cost effective.

Embodiments of the present disclosure incorporate the use of an extended piece (e.g., an extension portion) of conductive material of an interconnection component secured between two photovoltaic cells that connects to the rest of the circuit of the photovoltaic module, shingle, or system. In certain embodiments, the interconnection components including the extended piece may be positioned between photovoltaic cells located every n photovoltaic cells across the photovoltaic module, shingle, or system. In certain embodiments, the embodiments of the present disclosure enable easier integration of diodes (e.g., bypass diodes) into the photovoltaic module, shingle, or system and enable sub-cells to be placed in the often dead space located on the left and right ends of the photovoltaic module with a diode soldered in parallel. Thus, when a wireway shades the left and right edges of the photovoltaic module, shingle, or system, only the outermost photovoltaic cells may be bypassed, while the current of the entire string including the photovoltaic substrings of the module, shing, or system, may not be current limited.

Additionally, embodiments of the present disclosure enhance shade tolerance of the photovoltaic module, shingle, or system—even without utilizing of more expensive power electronics, such as optimizers and other power electronics. In existing photovoltaic modules, if a photovoltaic string is bypassed, such as due to partial shading, half the power of the module may be lost due to the bypass diode causing the entire shaded photovoltaic string to be bypassed. In embodiments of the present disclosure, with more easily integrated diodes, the shade tolerance of the photovoltaic module, shingle, or system can be tuned by integrating a bypass diode every n number of cells (e.g., every 5 photovoltaic cells). Using an exemplary scenario, in an existing design comprising two substrings, if one of the substrings is bypassed due to shading, the photovoltaic module may suffer 50% energy yield reduction. However, in exemplary embodiments of the present disclosure, the interconnection componentry may enable five substrings to be joined successively together where shading on one of the photovoltaic substrings only causes a 20% energy yield reduction.

Furthermore, embodiments of the present disclosure facilitate increased roof fill capabilities. For example, in existing designs, the space taken by a bus ribbon or other component utilized to connect substrings, may be utilized to incorporate additional photovoltaic cells into the photovoltaic module, shingle, or system. Additionally, photovoltaic cell-to-cell gaps may be avoided or reduced. Furthermore, embodiments of the present disclosure may deliver greater power output than an optimizer depending on the shading conditions, number of photovoltaic cells, and bypass diodes utilized. Embodiments of the present disclosure also enable simplified ribbon circuit formation and ribbon preparation. Moreover, embodiments of the present disclosure enable lower current to reduce the maximum operating temperature of an inverter-agnostic rapid shutdown device. Based on at least the foregoing, embodiments of the present disclosure provide substantial enhancements to existing technologies, while incorporating new technologies to provide greater power output for photovoltaic modules, shingles, and systems, enhanced shade tolerances, greater photovoltaic cell coverage, improved energy yield reduction, among other benefits.

Various embodiments are provided in the present disclosure. For example, in certain embodiments, a system including a plurality of photovoltaic modules installed on a roof deck of a structure is provided. In certain embodiments, one or more of the photovoltaic modules may include an electrical circuit that supplies power to the photovoltaic modules and deliver power generated by the photovoltaic modules. In certain embodiments, the one or more photovoltaic modules may include a plurality of photovoltaic substrings including a plurality of photovoltaic cells. In certain embodiments, the one or more photovoltaic modules may include at least one cell interconnection component including conductive material, such as, but not limited to, aluminum-based foil. In certain embodiments, the at least one cell interconnection component connects a negative terminal of a first photovoltaic cell of a first substring of the plurality of photovoltaic substrings to a positive terminal of a second photovoltaic cell of a second substring of the plurality of photovoltaic substrings to electrically connect the first and second photovoltaic cells. In certain embodiments, an extension portion of the at least one cell interconnection component may extend beyond a first edge of the first photovoltaic cell of the first substring, a second edge of the second photovoltaic cell of the second substring, or a combination thereof. In certain embodiments, the extension portion connects to at least one other substring of the plurality of photovoltaic substrings to electrically connect the first substring, the second substring, and the at least one other substring to the electrical circuit.

In certain embodiments, the system may include one or more bypass diodes, which, when triggered based on the presence of a condition, may bypass photovoltaic cells or substrings to which they are electrically connected. In certain embodiments, for example, the bypass diode may bypass only the first substring of the plurality of photovoltaic substrings in response to detection of a condition affecting the first substring of the plurality of photovoltaic substrings. In certain embodiments, the system may further include an end substring of the plurality of photovoltaic substrings that is located at an end of the photovoltaic module. In certain embodiments, the end substring may include a single photovoltaic cell and a bypass diode that bypass only the single photovoltaic cell of the end substring upon detection of a condition affecting the end substring. In certain embodiments, the conductive material of the at least one cell interconnection component may include laser-welded aluminum foil. In certain embodiments, the at least one cell interconnection component may include an aluminum-aluminum weld, rear laser metal bond, an aluminum-gold weld, a front laser metal bond, or a combination thereof.

In certain embodiments, each substring of the plurality of photovoltaic substrings may be connected to at least one other substring of the plurality of photovoltaic substrings via the at least one cell interconnection component. In certain embodiments, a cell interconnection component of the at least one cell interconnection component containing the extension portion may be located at every nth photovoltaic cell of the plurality of photovoltaic cells of the plurality of photovoltaic substrings. In certain embodiments, a set of the plurality of photovoltaic cells may be connected in parallel via the at least one cell interconnection component. In certain embodiments, the first photovoltaic cell and the second photovoltaic cell may be connected in series via the at least one cell interconnection component. In certain embodiments, the electrical circuit may include a bypass diode, an optimizer, a junction box, any other componentry, or a combination thereof.

In certain embodiments, a photovoltaic shingle installed on a roof deck of a structure is provided. In certain embodiments, the photovoltaic shingle may include a first layer and a second layer. In certain embodiments, the first layer may be a lowermost layer of the photovoltaic shingle, and which may secure or be placed onto the roof deck of the structure. In certain embodiments, the second layer may include an electrical circuit, a plurality of photovoltaic substrings including a plurality of photovoltaic cells, and at least one cell interconnection component comprising conductive material. In certain embodiments, the at least one cell interconnection component may connect a negative terminal of a first photovoltaic cell of a first substring of the plurality of photovoltaic substrings to a positive terminal of a second photovoltaic cell of a second substring of the plurality of photovoltaic substrings to electrically connect the first and second photovoltaic cells. In certain embodiments, an extension portion of the at least one cell interconnection component may extend beyond a first edge of the first photovoltaic cell of the first substring, a second edge of the second photovoltaic cell of the second substring, or a combination thereof. In certain embodiments, the extension portion may connect to at least one other substring of the plurality of photovoltaic substrings to electrically connect the first substring, the second substring, and the at least one other substring to the electrical circuit.

In certain embodiments, the photovoltaic shingle is installed on a roof deck of a structure. In certain embodiments, at least a portion of the plurality of photovoltaic cells may each be separated into a plurality of sub-cells. In certain embodiments, at least a portion of the plurality of photovoltaic cells may be connected via the at least one cell interconnection component in series to obtain a designated or desired voltage, power, or a combination thereof. In certain embodiments, the portion of the plurality of photovoltaic cells may be separated into a sub-cells via laser separation to obtain a designated or desired shade tolerance for the photovoltaic shingle.

In certain embodiments, a system including a plurality of photovoltaic modules installed on a roof deck is provided. In certain embodiments, each of the photovoltaic modules may include an electrical circuit, a plurality of photovoltaic substrings comprising a plurality of photovoltaic cells, and at least one cell interconnection component comprising conductive material. In certain embodiments, the at least one cell interconnection component may connect a negative terminal of a first photovoltaic cell of a first substring of the plurality of photovoltaic substrings to a positive terminal of a second photovoltaic cell of a second substring of the plurality of photovoltaic substrings to electrically connect the first and second photovoltaic cells. In certain embodiments, an extension portion of the at least one cell interconnection component may extend beyond a first edge of the first photovoltaic cell of the first substring, a second edge of the second photovoltaic cell of the second substring, or a combination thereof. In certain embodiments, the extension portion may be connected to at least one other substring of the plurality of photovoltaic substrings to electrically connect the first substring, the second substring, and the at least one other substring to the electrical circuit. In certain embodiments, the extension portion may be soldered to the electrical circuit to electrically connect the extension portion to the electrical circuit, the first substring, the second substring, the at least one other substring, or a combination thereof.

In certain embodiments, a method for utilizing photovoltaic devices including cell interconnection componentry is provided. In certain embodiments, he method may include monitoring a photovoltaic module installed on a roof of a structure for the presence of a condition affecting at least one photovoltaic substring of a plurality of photovoltaic substrings of the photovoltaic module. In certain embodiments, the presence of the condition may trigger operation of at least one bypass diode (and/or other component) of the photovoltaic module. wherein the photovoltaic module comprises the plurality of photovoltaic substrings including a plurality of photovoltaic cells and at least one cell interconnection component. In certain embodiments, the at least one cell interconnection component may be connected to a negative terminal of a first photovoltaic cell of a first substring of the plurality of photovoltaic substrings and to a positive terminal of a second photovoltaic cell of a second substring of the plurality of photovoltaic substrings to electrically connect the first and second photovoltaic cells.

In certain embodiments, an extension portion of the at least one cell interconnection component may extend beyond a first edge of the first photovoltaic cell of the first substring, a second edge of the second photovoltaic cell of the second substring, or a combination thereof. In certain embodiments, the extension portion may be connected to at least one other substring of the plurality of photovoltaic substrings to electrically connect the first substring, the second substring, and the at least one other substring to the electrical circuit. In certain embodiments, the at least one bypass diode may be connected to each of the plurality of photovoltaic substrings via the electrical circuit having the connection to the extension portion.

In certain embodiments, the method may include triggering, upon detection of the presence of the condition affecting the at least one photovoltaic substring, operation of the at least one bypass diode to cause the at least one bypass diode to bypass the at least one photovoltaic substring of the plurality of photovoltaic substrings affected by the presence of the condition. In certain embodiments, the method may include continuing operation of remaining photovoltaic substrings of the plurality of photovoltaic substrings of the photovoltaic module. In certain embodiments, the method may include ceasing operation of the at least one bypass diode upon detection that the condition affecting the at least one photovoltaic substring no longer exists. In certain embodiments, the method may further include stacking a first portion of the first photovoltaic cell onto a second portion of the second photovoltaic cell. In certain embodiments, the at least one cell interconnection component may be located where the first portion is stacked onto the second portion.

Figure 1:
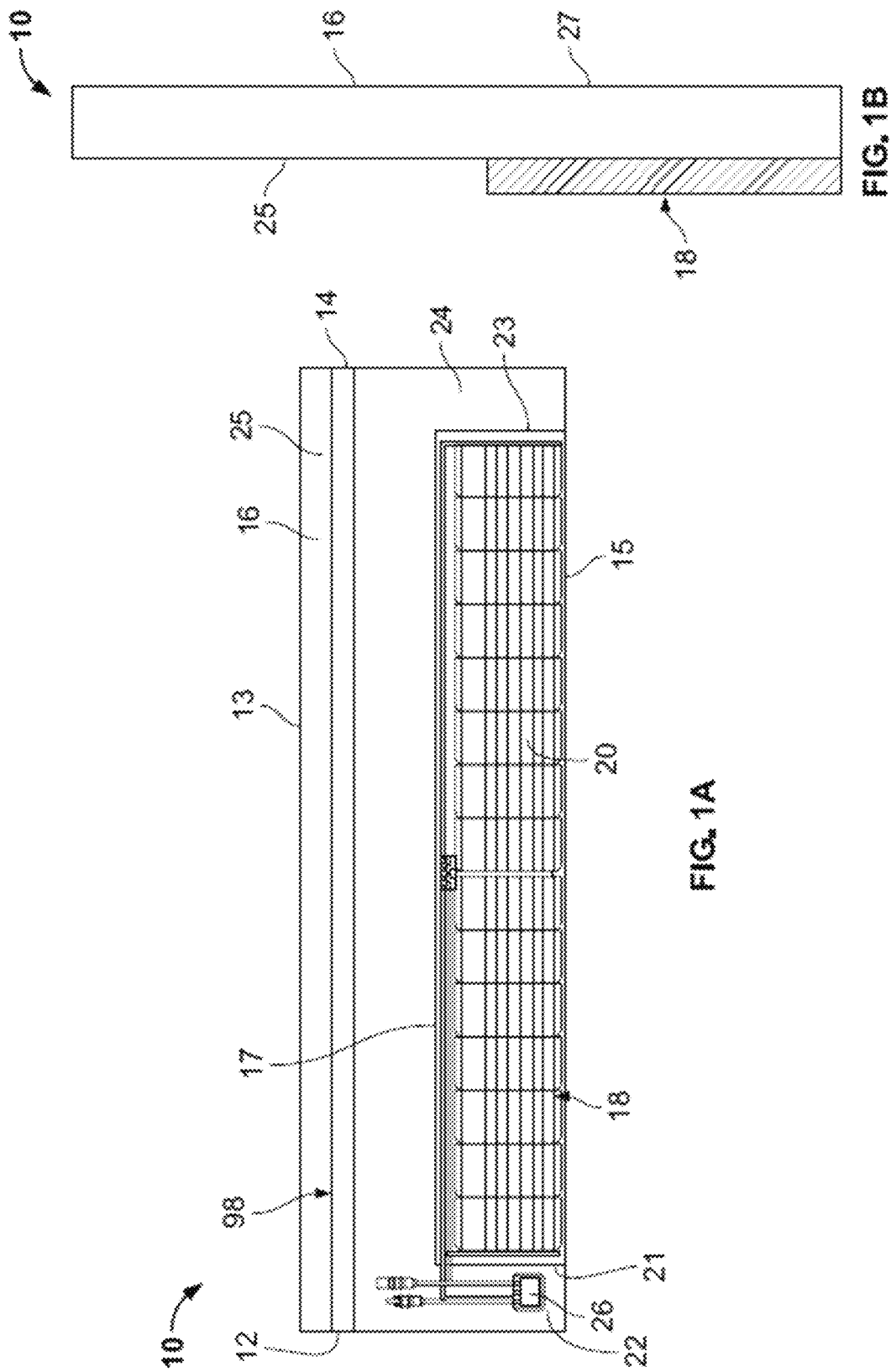
FIGS. 1A and 1B are a top plan view and a side elevational view, respectively of certain embodiments of a photovoltaic module of the present disclosure.

Referring to FIGS. 1A and 1B, in some embodiments, a photovoltaic module 10 includes a first end 12, a second end 14 opposite the first end 12, a first edge 13 extending from the first end 12 to the second end 14, and a second edge 15 opposite the first edge 13 and extending from the first end 12 to the second end 14. In some embodiments, the photovoltaic module 10 includes a headlap portion 16. In some embodiments, the headlap portion 16 extends from the first end 12 to the second end 14 and from the first edge 13 to a first location 17 between the first edge 13 and the second edge 15. In some embodiments, the photovoltaic module 10 includes a reveal portion 18. In some embodiments, the reveal portion 18 includes at least one solar cell 20. In some embodiments, the photovoltaic module 10 includes a first side lap 22 located at the first end 12. In some embodiments, the first side lap 22 includes a length extending from the first end 12 to a second location 21 between the first end 12 and the second end 14. In some embodiments, the photovoltaic module 10 includes a second side lap 24 located at the second end 14. In some embodiments, the second side lap 24 includes a length extending from the second end 14 to a third location 23 between the first end 12 and the second end 14. In some embodiments, the photovoltaic module 10 includes an outer surface 25 and an inner surface 27 opposite the outer surface 25. In some embodiments, the reveal portion 18 extends from the first side lap 22 to the second side lap 24 and from the second edge 15 to the first location 17. In some embodiments, the photovoltaic module 10 is installed on a building structure. In some embodiments, at least one junction box 26 is located on the first side lap 22. In some embodiments, the at least one junction box 26 includes a plurality of the junction boxes 26. In some embodiments, the photovoltaic module 10 includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled "Building Integrated Photovoltaic System," owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

In some embodiments, the at least one solar cell 20 includes a plurality of the solar cells 20. In some embodiments, the plurality of solar cells 20 includes two solar cells. In some embodiments, the plurality of solar cells 20 includes three solar cells. In some embodiments, the plurality of solar cells 20 includes four solar cells. In some embodiments, the plurality of solar cells 20 includes five solar cells. In some embodiments, the plurality of solar cells 20 includes six solar cells. In some embodiments, the plurality of solar cells 20 includes seven solar cells. In some embodiments, the plurality of solar cells 20 includes eight solar cells. In some embodiments, the plurality of solar cells 20 includes nine solar cells. In some embodiments, the plurality of solar cells 20 includes ten solar cells. In some embodiments, the plurality of solar cells 20 includes eleven solar cells. In some embodiments, the plurality of solar cells 20 includes twelve solar cells. In some embodiments, the plurality of solar cells 20 includes thirteen solar cells. In some embodiments, the plurality of solar cells 20 includes fourteen solar cells. In some embodiments, the plurality of solar cells 20 includes fifteen solar cells. In some embodiments, the plurality of solar cells 20 includes sixteen solar cells. In some embodiments, the plurality of solar cells 20 includes more than sixteen solar cells.

In some embodiments, the plurality of solar cells 20 is arranged in one row (i.e., one reveal). In another embodiment, the plurality of solar cells 20 is arranged in two rows (i.e., two reveals). In another embodiment, the plurality of solar cells 20 is arranged in three rows (i.e., three reveals). In another embodiment, the plurality of solar cells 20 is arranged in four rows (i.e., four reveals). In another embodiment, the plurality of solar cells 20 is arranged in five rows (i.e., five reveals). In another embodiment, the plurality of solar cells 20 is arranged in six rows (i.e., six reveals). In other embodiments, the plurality of solar cells 20 is arranged in more than six rows. In some embodiments, the at least one solar cell 20 is electrically inactive (i.e., a "dummy" solar cell).

Figure 2:
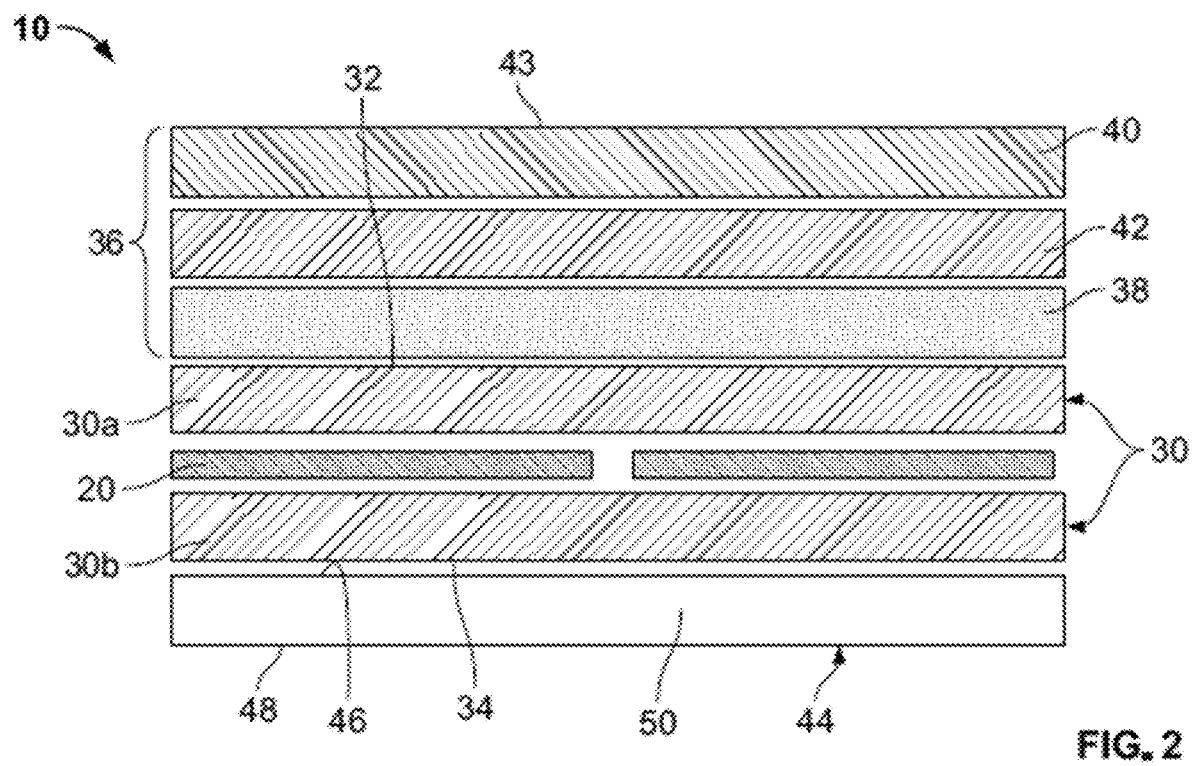
FIGS. 2 and 3 are schematic views of certain embodiments of a photovoltaic module of the present disclosure.
Figure 3:
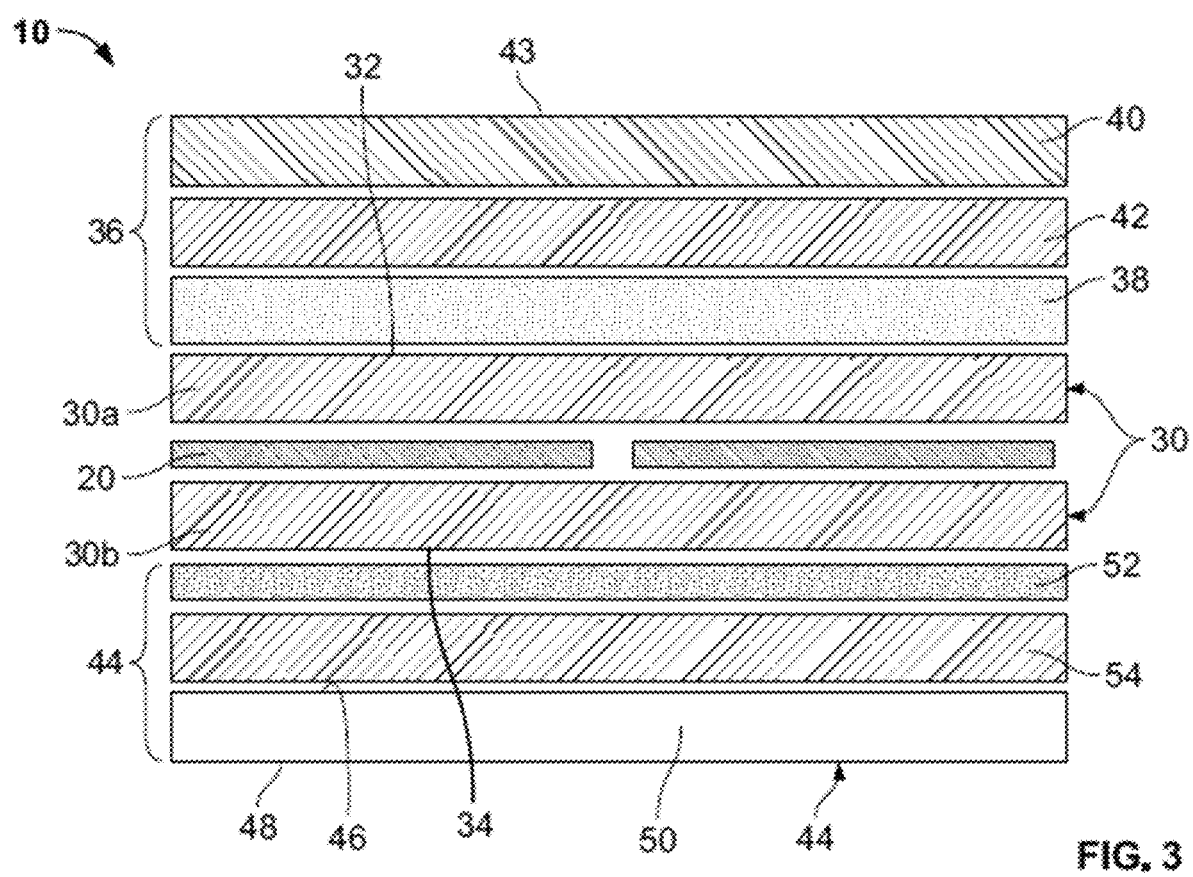

Referring to FIGS. 2 and 3, in some embodiments, the photovoltaic module 10 includes an encapsulant 30 encapsulating the at least one solar cell 20. In some embodiments, the encapsulant 30 includes a first layer 30a having a first surface 32 and a second layer 30b having a second surface 34 opposite the first surface 32. In some embodiments, the photovoltaic module 10 includes a frontsheet 36 juxtaposed with the first surface 32 of the first layer 30a of the encapsulant 30. In some embodiments, the frontsheet 36 includes a glass layer 38. In some embodiments, the frontsheet 36 includes a polymer layer 40 attached to the glass layer 38. In some embodiments, the polymer layer 40 forms an upper surface of the photovoltaic module 10. In some embodiments, the polymer layer 40 is attached to the glass layer 38 by a first adhesive layer 42. In some embodiments, an upper surface 43 of the polymer layer 40 is an upper surface of the photovoltaic module 10. In some embodiments, the upper surface 43 of the polymer layer 40 is textured. In some embodiments, the upper surface 43 of the polymer layer 40 is embossed. In some embodiments, the upper surface 43 of the polymer layer 40 is embossed with a plurality of indentations. In some embodiments, the upper surface 43 of the polymer layer 40 includes a pattern. In some embodiments, the upper surface 43 of the polymer layer 40 includes a printed pattern. In some embodiments, the upper surface 43 of the polymer layer 40 includes an embossed pattern. In some embodiments, the upper surface 43 of the polymer layer 40 includes a textured pattern.

In some embodiments, the photovoltaic module 10 includes a backsheet 44. In some embodiments, the backsheet 44 is juxtaposed with the second surface 34 of the second layer 30b of the encapsulant 30. In some embodiments, the backsheet 44 includes a first surface (top surface) 46 and a second surface (bottom surface) 48 opposite the first surface 46 of the backsheet 44. In some embodiments, the second surface 48 of the backsheet 44 forms a lower surface of the photovoltaic module 10. In some embodiments, the backsheet 44 includes a first layer 50. In some embodiments, the backsheet 44 includes a second layer 52 (see FIG. 3). In some embodiments, the second layer 52 is attached to the first layer 50 by a second adhesive layer 54. In some embodiments, the backsheet 44 includes only one layer (see FIG. 2). In some embodiments, the backsheet 44 includes only the first layer 50 (see FIG. 2). In some embodiments, the backsheet 44 does not include the second layer 52 (see FIG. 2). In some embodiments, the backsheet 44 is composed of a polymer. In some embodiments, the backsheet 44 is composed of thermoplastic polyolefin (TPO). In some embodiments, the backsheet 44 forms the headlap portion 16.

In some embodiments, each of the encapsulant 30, the frontsheet 36, including each of the glass layer 38, the polymer layer 40, and the first adhesive layer 42, and the backsheet 44, including the first layer 50, the second layer 52, and the second adhesive layer 54 of the photovoltaic module 10, as applicable, includes a structure, composition and/or function of similar to those of more or one of the embodiments of the corresponding components disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

Figure 4:
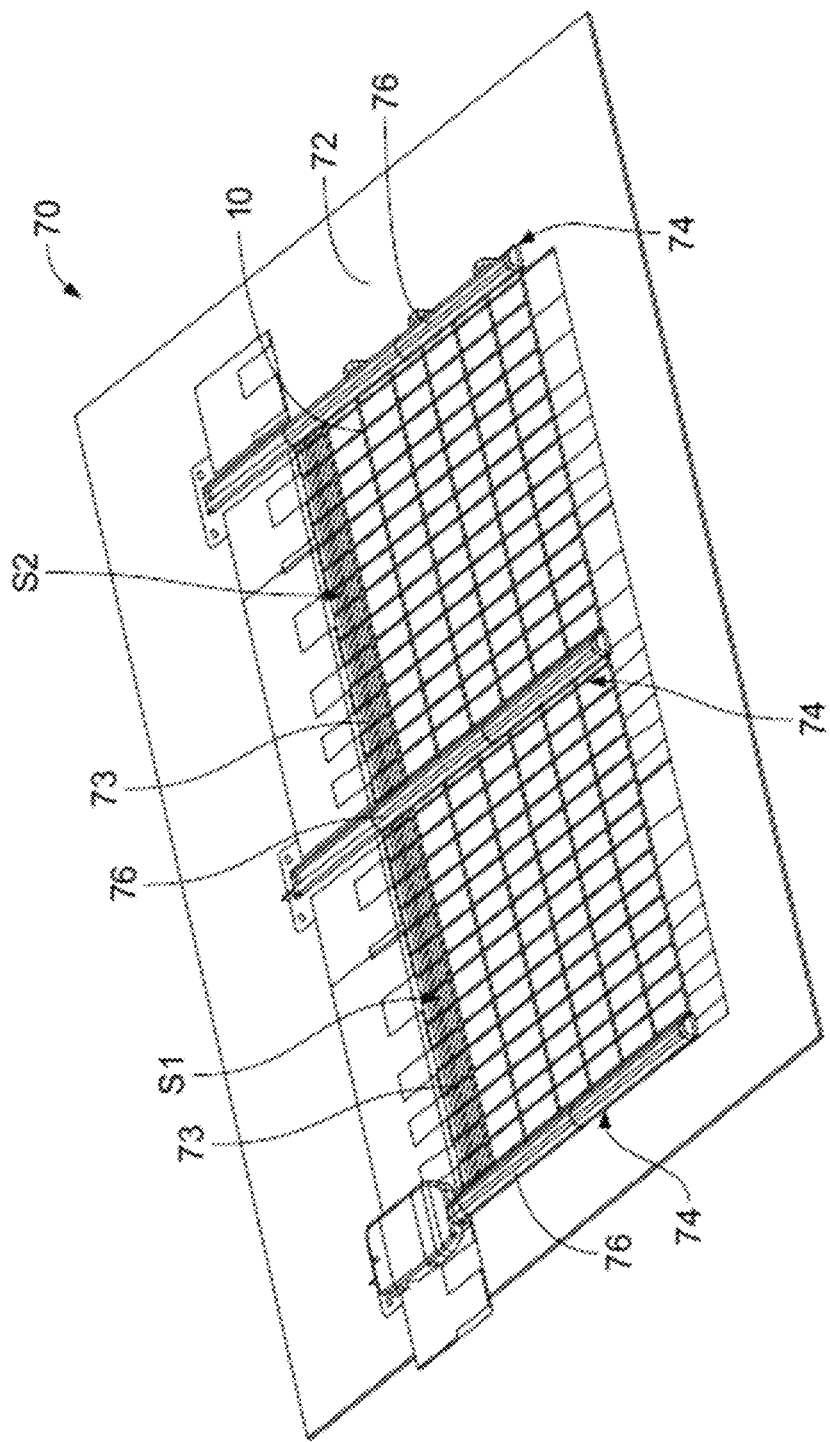
FIG. 4 is a top perspective view of certain embodiments of a photovoltaic system.

Referring to FIG. 4, in some embodiments, a system 70 includes a plurality of the photovoltaic modules 10 installed on a roof deck 72. In some embodiments, the plurality of the photovoltaic modules 10 is arranged in an array on the roof deck 72. In some embodiments, the array of the photovoltaic modules 10 includes subarrays S1, S2. In certain embodiments, the array includes more than the two subarrays S1, S2. In some embodiments, the array includes a single array S1. In some embodiments, each of the subarrays S1, S2 include a plurality of rows of the photovoltaic modules 10.

In some embodiments, the reveal portion 18 of one of the photovoltaic modules 10 in the subarray S1 overlays the head lap portion 16 of an adjacent another one of the photovoltaic modules 10 of the subarray S1. In some embodiments, at least a portion of the first side lap 22 of the one of the photovoltaic modules 10 overlays at least a portion of the first side lap 22 of the another one of the photovoltaic modules 10. In some embodiments, at least a portion of the second side lap 24 of the one of the photovoltaic modules 10 overlays at least a portion of the second side lap 24 of the another one of the photovoltaic modules 10.

In some embodiments, the first side lap 22 of one of the photovoltaic modules 10 in the subarray S2 overlays the second side lap 24 of an adjacent another one of the photovoltaic modules 10 in the subarray S1 in the same one of the rows R. In some embodiments, a jumper module 73 overlays an uppermost one of the photovoltaic modules 10 in a column of the subarray S1. In some embodiments, the active portion of the jumper module 73 overlays the head lap portion 16 of the photovoltaic module 10.

In some embodiments, the roof deck 72 is a steep slope roof deck. As defined herein, a "steep slope roof deck" is any roof deck that is disposed on a roof having a pitch of Y/X, where Y and X are in a ratio of 4:12 to 20:12, where Y corresponds to the "rise" of the roof, and where X corresponds to the "run" of the roof.

In some embodiments, the plurality of photovoltaic modules 10 is installed directly to the roof deck 72. In some embodiments, the plurality of photovoltaic modules 10 is installed above an underlayment layer installed on the roof deck 72. In some embodiments, the plurality of photovoltaic modules 10 is installed on an underlayment layer installed on the roof deck 72. In some embodiments, each of the plurality of photovoltaic modules 10 is installed on the roof deck 72 by a plurality of fasteners. In some embodiments, the plurality of fasteners is installed through the headlap portion 16. In some embodiments, the plurality of fasteners is installed within a nail zone 98 of the headlap portion 16. In some embodiments, the plurality of fasteners include a plurality of nails. In some embodiments, the plurality of fasteners includes a plurality of rivets. In some embodiments, the plurality of fasteners includes a plurality of screws. In some embodiments, the plurality of fasteners includes a plurality of staples.

In some embodiments, each of the plurality of photovoltaic modules 10 does not include a frame. In some embodiments, each of the plurality of photovoltaic modules 10 does not include a frame on or around a periphery thereof. In some embodiments, as used herein, the term "frame" means a solar panel frame installed on one or more side, or all sides, of a periphery of a solar module to seal and fix solar module components thereof, and, in some embodiments, is composed of a metal, such as aluminum or extruded aluminum, or a polymer.

In some embodiments, each of the plurality of photovoltaic modules 10 is installed on the roof deck 72 by an adhesive. In some embodiments, the adhesive is adhered directly to the roof deck 72. In some embodiments, the adhesive is adhered to an underlayment. In some embodiments, the underlayment is adhered directly to the roof deck 72. In some embodiments, the adhesive is located on a rear surface of the photovoltaic module 10. In some embodiments, the adhesive includes at least one adhesive strip. In some embodiments, the adhesive includes a plurality of adhesive strips. In some embodiments, the plurality of adhesive strips is arranged intermittently. In some embodiments, the adhesive is located proximate to at least one edge of the photovoltaic module 10, including the first edge 13 and the second edge 15. In some embodiments, the adhesive is a peel and stick film sheet. In some embodiments, the peel and stick film sheet includes at least one sheet of film removably attached to the inner surface 27. In some embodiments, the peel and stick film sheet is composed of Ever-Guard Freedom HW peel and stick membrane manufactured by GAF. In some embodiments, the adhesive includes polyvinyl butyrate, acrylic, silicone, or polycarbonate. In some embodiments, the adhesive includes pressure sensitive adhesives.

In some embodiments, the system 70 includes at least one wireway 74 installed proximate to the first ends 12 of the photovoltaic modules 10. In some embodiments, the at least one wireway 74 is installed proximate to the second end 14 of the photovoltaic modules 10. In some embodiments, the at least one wireway 74 is installed intermediate the first end 12 of one of the photovoltaic modules 10 and a second end 14 of another one of the photovoltaic modules 10. In some embodiments, the at least one wireway 74 includes a lid 76. In some embodiments, the lid 76 is removably attached to the at least one wireway 74. In some embodiments, the at least one wireway 74 includes a plurality of the wireways 74. In some embodiments, one of the lids 76 of one of the plurality of wireways 74 overlaps another of the lids 76 of another of the plurality of wireways 74. In some embodiments, the at least one wireway 74 includes a height of 1 mm to 20 mm. In some embodiments, the at least one wireway 74 includes a single wireway installed proximate to the first end of each of the photovoltaic modules 10. In some embodiments, the at least one wireway 74 does not include any electrical components or electrical wires or cables therein. In some embodiments, the at least one wireway 74 and the lids 76 include a structure, composition and/or function of similar to those of more or one of the embodiments of the wireways and lids disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

Figure 5:
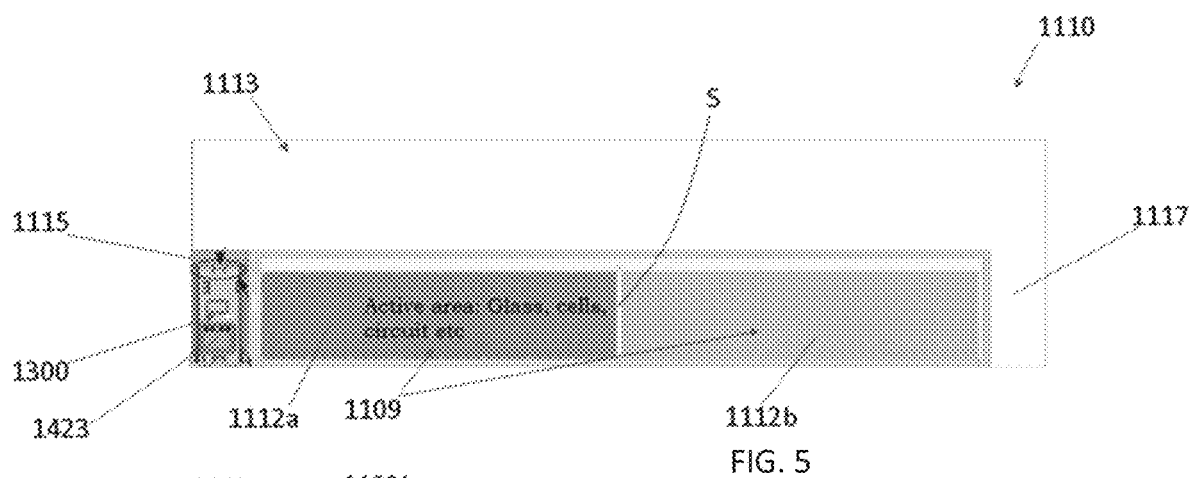
FIGS. 5 and 6 illustrate top plan views of embodiments of a photovoltaic module for use with a photovoltaic string according to embodiments of the present disclosure.
Figure 6:
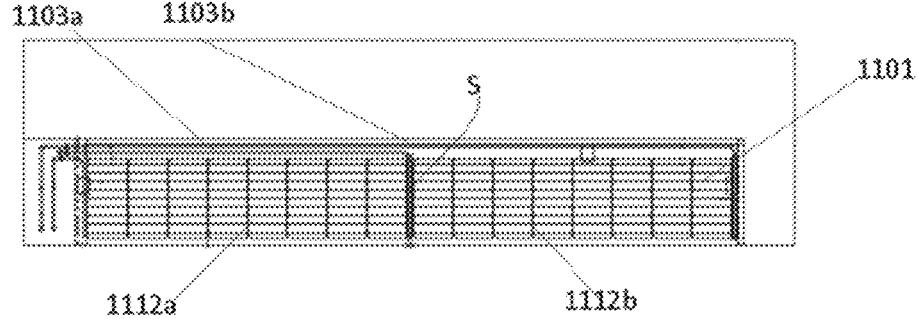

Referring to FIGS. 5 and 6, in certain embodiments, a photovoltaic module 1110 includes an active area 1109 having a plurality of solar cells 1112. In certain embodiments, the photovoltaic module 1110 includes an inactive area comprising a headlap portion 1113, a first side lap 1115 located at one end of the photovoltaic module 1110, and a second side lap 1117 located at an opposite end of the photovoltaic module 1110. In certain embodiments, the headlap portion 1113 is textured. In certain embodiments, the texture of the headlap portion 1113 is different from a texture of the solar cells 1112. In certain embodiments, a wire cover bracket 1300 is attached to the first side lap 1115. In certain embodiments, the wire cover bracket 1300 includes a junction box 1423. Details of the wire cover bracket 1300 shall be provided hereinbelow. In certain embodiments, the plurality of solar cells 1112 includes a first set of solar cells 1112a and a second set of solar cells 1112b. In certain embodiments, the first set of solar cells 1112a includes eight of the solar cells 1112. In certain embodiments, the second set of solar cells 1112b includes eight of the solar cells 1112. In certain embodiments, each of the first set of solar cells 1112a and the second set of solar cells 1112b includes more or less than eight of the solar cells 1112. In certain embodiments, a last one of the solar cells 1112 of the first set of solar cells 1112a is separated by a first one of the solar cells 1112 of the second set of solar cells 1112b by a space S. In certain embodiments, the space S is located approximately half the length of the photovoltaic module 1110. In certain embodiments, the solar cells 1112 of each of the first and second sets of solar cells 1112a, 1112b are strung together with bussing 1101. In certain embodiments, the bussing 1101 includes nine bussing wires. In certain embodiments, the bussing 1101 may include more or less than the nine bussing wires. In certain embodiments, a first bussing wire 1103a extends from the first side lap 1115 to the space S. In certain embodiments, the first bussing wire 1103a extends to approximately half the length of the photovoltaic module 1110. In certain embodiments, one end of the first bussing wire 1103a is electrically connected to the junction box 1423 and the other end of the first bussing wire 1103a is electrically connected to the first set of solar cells 1112a. In certain embodiments, a second bussing wire 1103b extends from the first side lap 1115 to a location proximate to the second side lap 1117. In certain embodiments, the second bussing wire 1103b extends substantially the entire length of the photovoltaic module 1110. In certain embodiments, one end of the second bussing wire 1103b is electrically connected to the junction box 1423 and the other end of the second bussing wire 1103b is electrically connected to the second set of solar cells 1112b. In certain embodiments, each of the first bussing wire 1103a and the second bussing wire 1103b is covered with a polymer layer. In certain embodiments, each of the first bussing wire 1103a and the second bussing wire 1103b is covered with expanded polyethylene ("EPE"). In certain embodiments, the EPE is comprised of a black strip. In certain embodiments, each of the first bussing wire 1103a and the second bussing wire 1103b is coated with a colorant or dye to reduce reflectivity. In certain embodiments, the plurality of solar cells 1112 includes a plurality of the solar cells 1112. In certain embodiments, the plurality of solar cells 1112 is arranged in one row (i.e., one reveal). In certain embodiments, the plurality of solar cells 1112 is arranged in two rows (i.e., two reveals). In certain embodiments, the plurality of solar cells 1112 is arranged in three rows (i.e., three reveals). In certain embodiments, the plurality of solar cells 1112 is arranged in four rows (i.e., four reveals). In certain embodiments, the plurality of solar cells 1112 is arranged in five rows (i.e., five reveals). In certain embodiments, the plurality of solar cells 1112 is arranged in six rows (i.e., six reveals). In certain embodiments, the plurality of solar cells 1112 is arranged in more than six rows.

Figure 7:
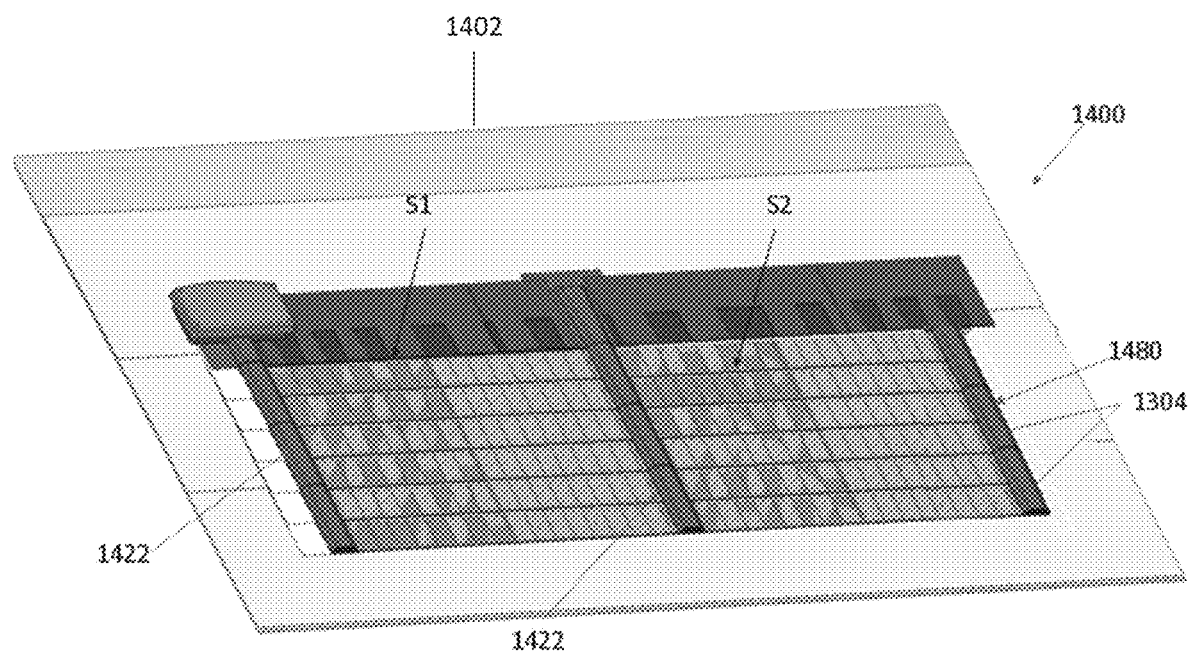
FIG. 7 illustrates a top perspective view of embodiments of a building integrated photovoltaic system installed on a roof deck.

Referring to FIG. 7, in certain embodiments, the photovoltaic system 1400 is installed on the roof deck 1402. In certain embodiments, an additional, non-active (i.e., "dummy") wireway 1480 and associated cover 1304, similar to the at least one wireway 1422 and the associated covers 1304, may be installed on the end of the second subarray S2 for symmetry and aesthetics. In certain embodiments, the non-active wireway 1480 is installed over the second side laps 1117 of the photovoltaic modules 1110b. In certain embodiments, the non-active wireway 1480 does not include any electrical components or electrical wiring. In certain embodiments, the non-active wireway 1480 is optional and need not be included. In certain embodiments, roofing shingles overlay the second side laps 1117 of the photovoltaic modules 1110b of the second subarray S2. In certain embodiments, it should be understood that the non-active wireway 1480 or roofing shingles may overlay the second side laps 1117 of the photovoltaic modules 1110a of the first subarray S1 in the absence of the second subarray S2.

In some embodiments, each of the photovoltaic modules 1110 includes a structure, composition, components, and/or function similar to those of one or more embodiments of the photovoltaic shingles and modules disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

Figure 8:
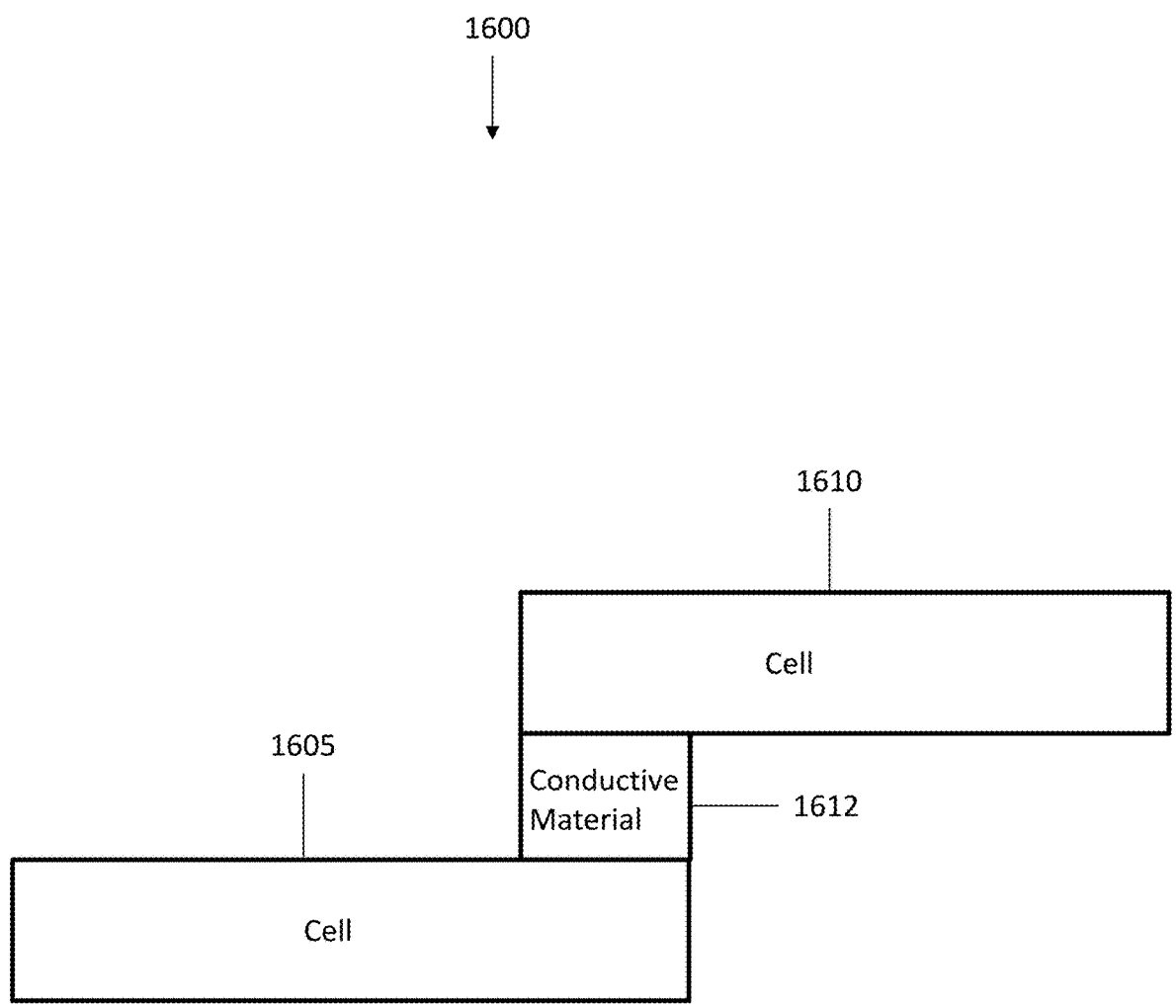
FIG. 8 illustrates a side view of exemplary photovoltaic cells of a photovoltaic module or shingle connected by an interconnection component according to embodiments of the present disclosure.

Referring to FIG. 8, in certain embodiments, a side view of exemplary photovoltaic cells 1605, 1610 of a photovoltaic module 1600 (or system) connected by an interconnection component 1612 is schematically illustrated. In some embodiments, the photovoltaic module 1600 is a photovoltaic shingle. Illustratively, the photovoltaic module 1600 may include a first photovoltaic cell 1605 and a second photovoltaic cell 1610, however, any number of photovoltaic cells 1605, 1610 may be utilized. In certain embodiments, the photovoltaic module 1600 may also include an interconnection component, comprising conductive material. In certain embodiments, the conductive material may comprise but is not limited to, laser-welded aluminum foil, an aluminum-aluminum weld, rear laser metal bond, an aluminum-gold weld, a front laser metal bond, or a combination thereof. In certain embodiments, the interconnection component 1612 may connect the first photovoltaic cell 1605 and second photovoltaic cell 1610 together. For example, the interconnection component 1612 may be connected to a negative terminal of the first photovoltaic cell 1605 and to a positive terminal of the second photovoltaic cell 1610. In certain embodiments, the interconnection component 1612 may be secured to the terminals, which may be located at ends of the photovoltaic cells 1605, 1610, as shown in FIG. 8. In certain embodiments, the interconnection component 1612 may be utilized to connect the first and second photovoltaic cells 1605, 1610 in series, as shown in FIG. 8. Notably, the photovoltaic module 1600 may be utilized with any of the photovoltaic shingles, modules, and systems of FIGS. 1A-29.

Figure 9:
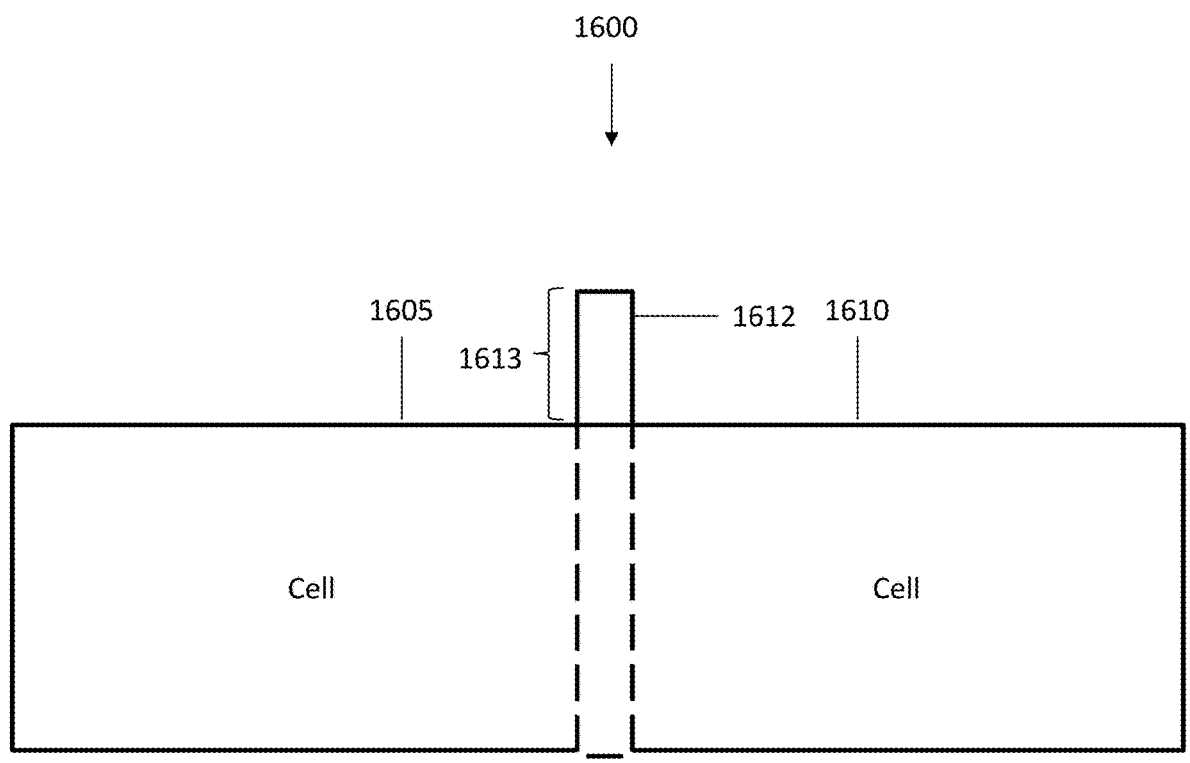
FIG. 9 illustrates a top view of exemplary photovoltaic cells of a photovoltaic module or shingle connected by an interconnection component according to embodiments of the present disclosure.

Referring now also to FIG. 9, a top view of the exemplary photovoltaic cells 1605, 1610 of a photovoltaic module 1600 connected by an interconnection component 1612 is schematically illustrated. The photovoltaic module 1600 may include first and second photovoltaic cells 1605, 1610, which may have negative and positive terminals which may be connected by utilizing the interconnection component 1612. In certain embodiments, the interconnection component 1612, may have an extension portion 1613 that may extend beyond the edges of the first and second photovoltaic cells 1605, 1610 to which the interconnection component 1612 is secured. In certain embodiments, the extension portion 1613 may connect to an electrical circuit of a photovoltaic module 1600, such as by soldering the extension portion 1613 onto a wire of the electrical circuit, conductive portion of the electrical circuit (e.g., conductive metal), or a combination thereof. In certain embodiments, the extension portion 1613 may connect to the electrical circuit by crimping the extension portion 1613 onto the electrical circuit, conjoining the extension portion 1613 with conductive componentry of the electrical circuit, other connection techniques, or a combination thereof.

Figure 10:
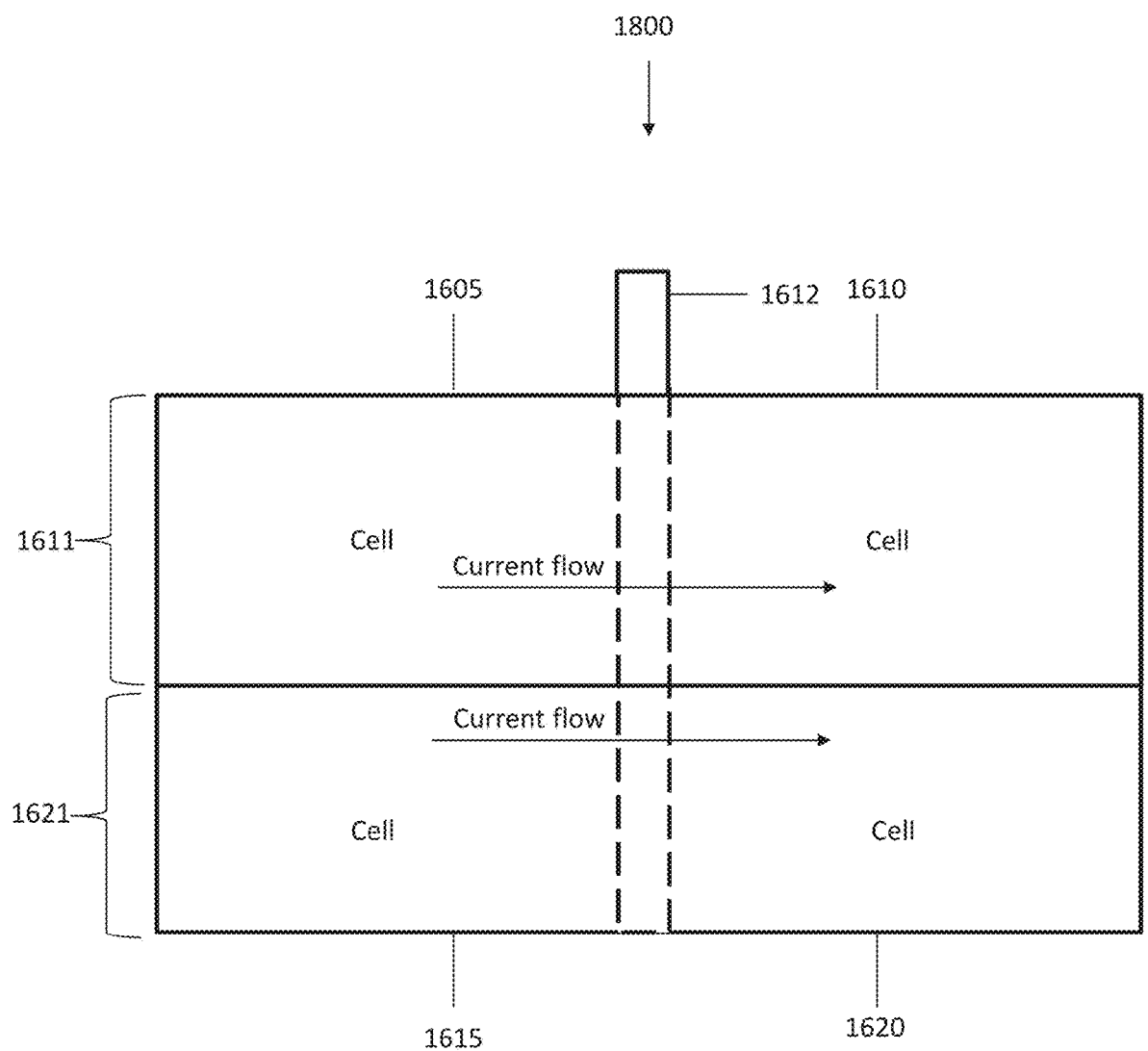
FIG. 10 illustrates a top view of a pair of parallel substrings including a plurality of photovoltaic cells connected by an interconnection component according to embodiments of the present disclosure.

Referring now also to FIG. 10, a top view of a pair of parallel photovoltaic strings 1611, 1621 including a plurality of photovoltaic cells 1605, 1610, 1615, 1620 connected by an interconnection component 1612 according to embodiments of the present disclosure is schematically illustrated. In certain embodiments, the interconnection component 1612 may be the same or similar to interconnection component 1612. In certain embodiments, the interconnection component 1612 may connect a number of the photovoltaic cells 1605, 1610, 1615, 1620 together. As shown in FIG. 10, the interconnection component may be connect the photovoltaic strings 1611, 1621 in parallel. In certain embodiments, the photovoltaic cells 1605, 1610 of the photovoltaic string 1611 may be connected in series and the current flowing through the photovoltaic module 1600 may flow from photovoltaic cell 1605 across to photovoltaic cell 1610. Similarly, the photovoltaic cells 1615, 1620 of the photovoltaic string 1621 may be connected in series and the current flowing through the photovoltaic module 1600 may flow from photovoltaic cell 1615 across to photovoltaic cell 1620.

Figure 11:
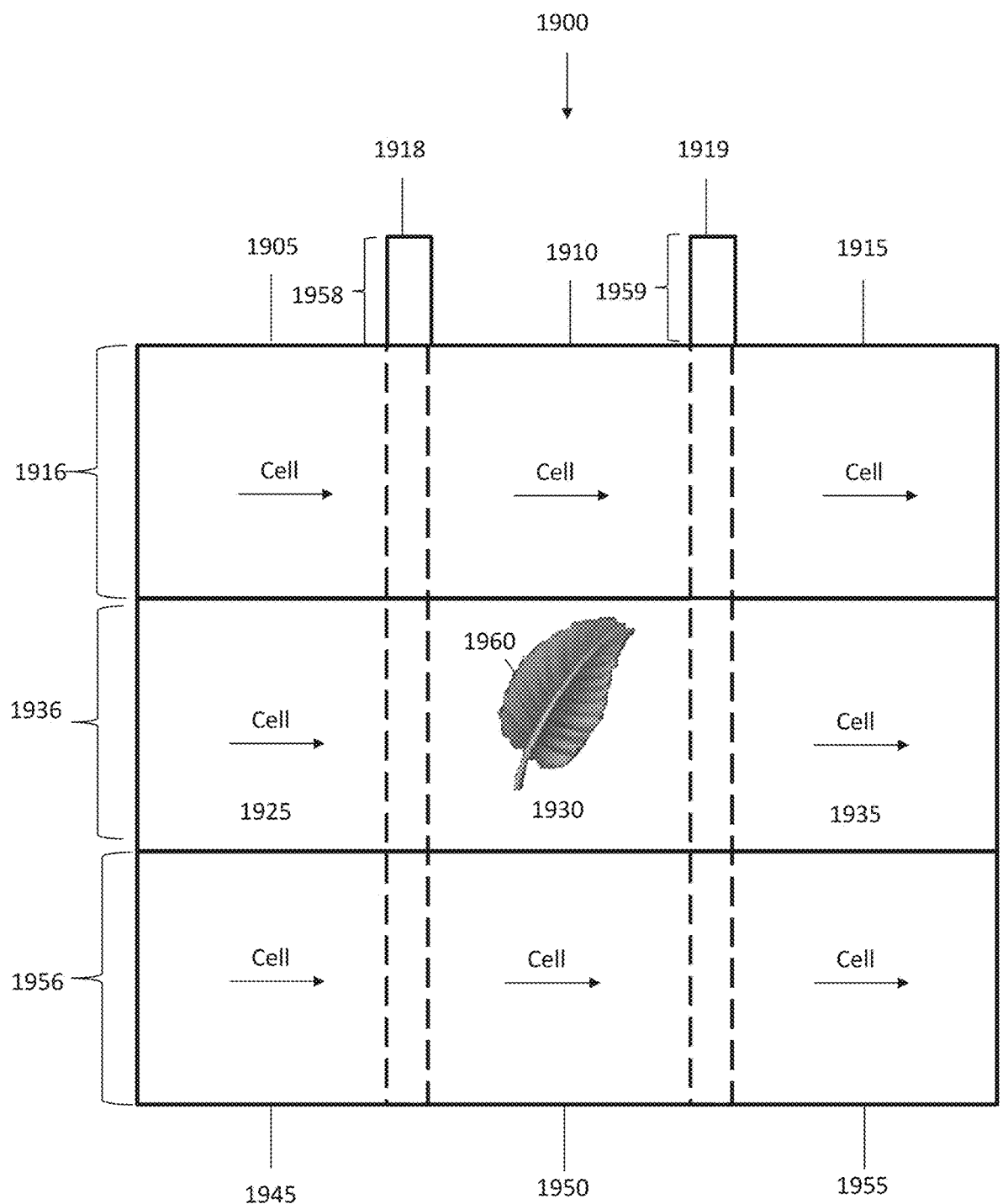
FIG. 11 illustrates a top view of three parallel substrings including a plurality of photovoltaic cells connected by multiple interconnection components according to embodiments of the present disclosure.

Referring now also to FIG. 11, a top view of three parallel photovoltaic substrings 1916, 1936, 1956 of a photovoltaic module 1900 including a plurality of photovoltaic cells 1905, 1910, 1915, 1925, 1930, 1935, 1945, 1950, 1955 connected by multiple interconnection components 1918, 1919 according to embodiments of the present disclosure is shown. In some embodiments, the photovoltaic module 1900 is a photovoltaic shingle. In certain embodiments, the interconnection components 1918, 1919 may connect the photovoltaic substrings 1916, 1936, 1956 together. In certain embodiments, the interconnection component 1918 connects photovoltaic cells 1905, 1910, photovoltaic cells 1925, 1930, and photovoltaic cells 1945, 1950. In certain embodiments, the interconnection component 1919 may connect photovoltaic cells 1910, 1915, photovoltaic cells 1930, 1935, and photovoltaic cells 1950, 1955. In certain embodiments, the extension portions 1958, 1959 may be connected to an electrical circuit supplying power to the photovoltaic module 1900.

In certain embodiments, for example, an artifact or object 1960 may partially shade one or more of the photovoltaic cells 1905, 1910, 1915, 1925, 1930, 1935, 1945, 1950, 1955. For example, in FIG. 11, the object 1960 may be a leaf that may have fallen onto photovoltaic cell 1930. If, for example, the photovoltaic module 1900 is fitted with bypass diodes, such as bypass diodes connectable to an electrical circuit connected to the extension portions 1958, 1959 of the interconnection components 1918, 1919, the shading caused by the leaf may only cause the photovoltaic cell 1930 to be bypassed and the other remaining photovoltaic cells 1905, 1910, 1915, 1925, 1935, 1945, 1950, 1955 may remain operational and current may flow through the remaining photovoltaic cells 1905, 1910, 1915, 1925, 1935, 1945, 1950, 1955. Additionally, the remaining photovoltaic cells 1905, 1910, 1915, 1925, 1935, 1945, 1950, 1955 may continue to absorb solar energy from sunlight to generate electricity that may then be converted from direct current electricity to more readily usable alternating current electricity. In certain embodiments, the foregoing capability enables maximized power generation, such as in the case of partial shading. In certain embodiments, the interconnection components 1918, 1919 may interconnect two photovoltaic cells 1905, 1910, 1915, 1925, 1930, 1935, 1945, 1950, 1955 in series, interconnect parallel photovoltaic substrings 1916, 1936, 1956, and extend (i.e., by utilizing the extension portions 1958, 1959) for facilitating easy connection to the electrical circuit of the photovoltaic module 1900 including connections to bypass diodes, optimizers, junction boxes, any other componentry connectable to an electrical circuit, or a combination thereof.

Figure 12:
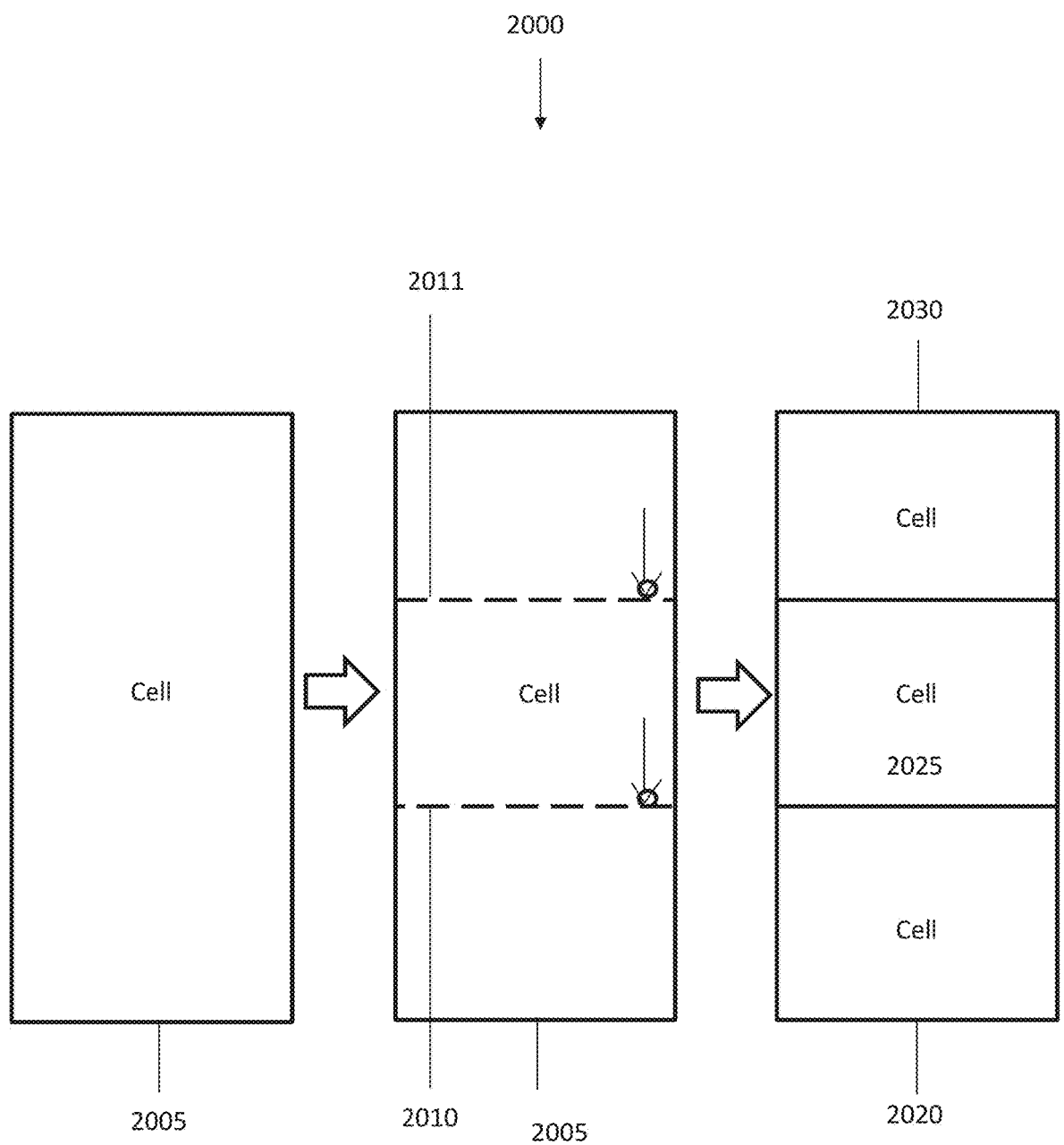
FIG. 12 illustrates an exemplary process of creating sub-cells within a photovoltaic cell prior to interconnection according to embodiments of the present disclosure.

Referring now also to FIG. 12, an exemplary process 2000 of creating sub-cells 2020, 2025, 2030 within a photovoltaic cell 2005 prior to interconnection according to embodiments of the present disclosure is shown. For example, a preliminary photovoltaic cell 2005 may be provided having a cell size, as shown in the far left image in FIG. 12. In certain embodiments, the photovoltaic cell 2005 may comprise silicon and other materials that may be utilized with photovoltaic cells. The process 2000 may then include utilized laser separation of the silicon of the photovoltaic cell 2005, as shown in the middle image of FIG. 12. In certain embodiments, the laser separation (or other cell dividing or separation technique) may be performed so that the sub-cells 2020, 2025, 2030 created by the separation may be the same size, similar in size, or any other selected or desired sizes. For example, in embodiments where the sub-cells 2020, 2025, 2030 are to be equal in size, the photovoltaic cell 2005 may be separated at lines 2011, 2010 to create photovoltaic sub-cells 2020, 2025, 2030, as shown in the far right image of FIG. 12.

Figure 13:
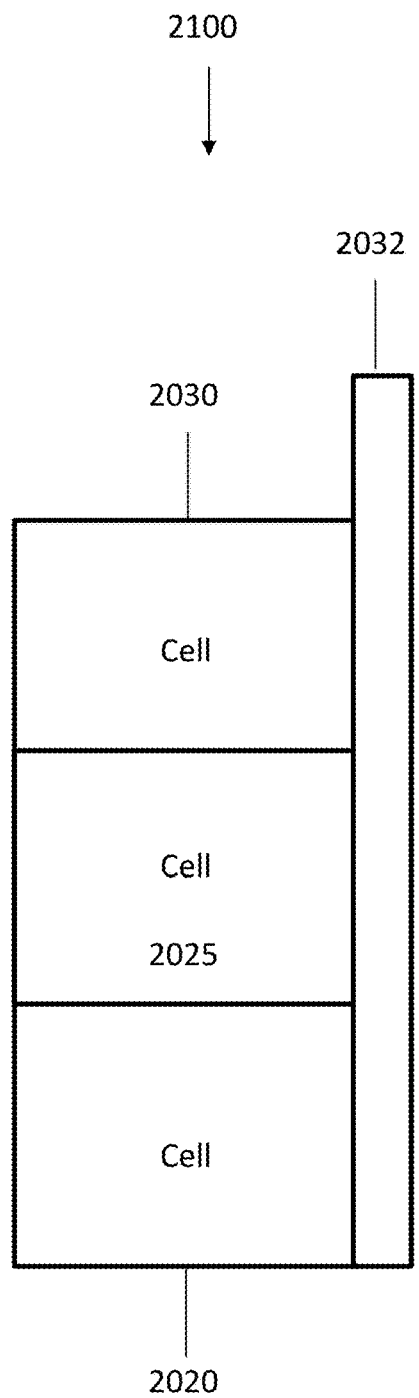
FIG. 13 illustrates an exemplary process of placing interconnection componentry material on an edge of parallel photovoltaic cells according to embodiments of the present disclosure.
Figure 14:
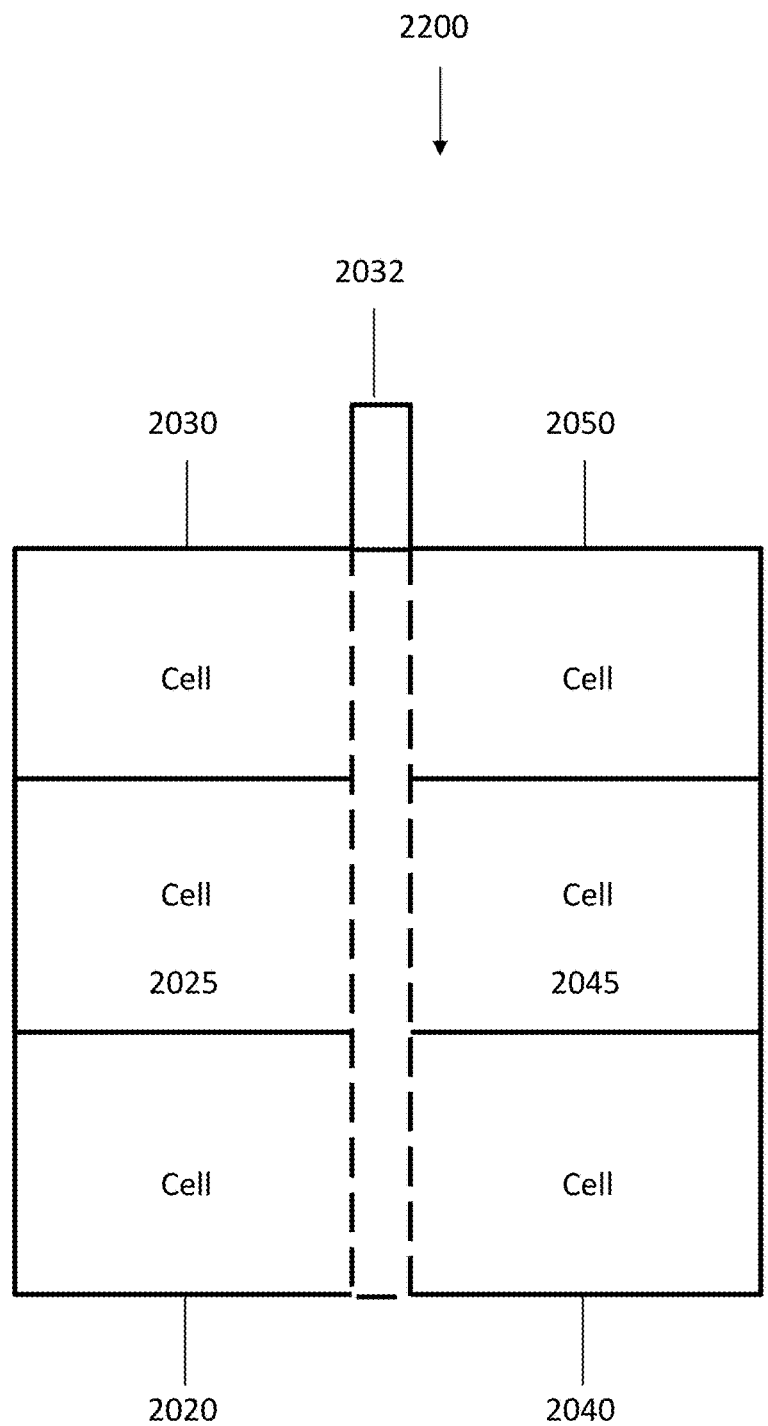
FIG. 14 illustrates an exemplary process involving bonding of a second set of photovoltaic cells using the interconnection componentry of FIG. 21 according to embodiments of the present disclosure.
Figure 15:
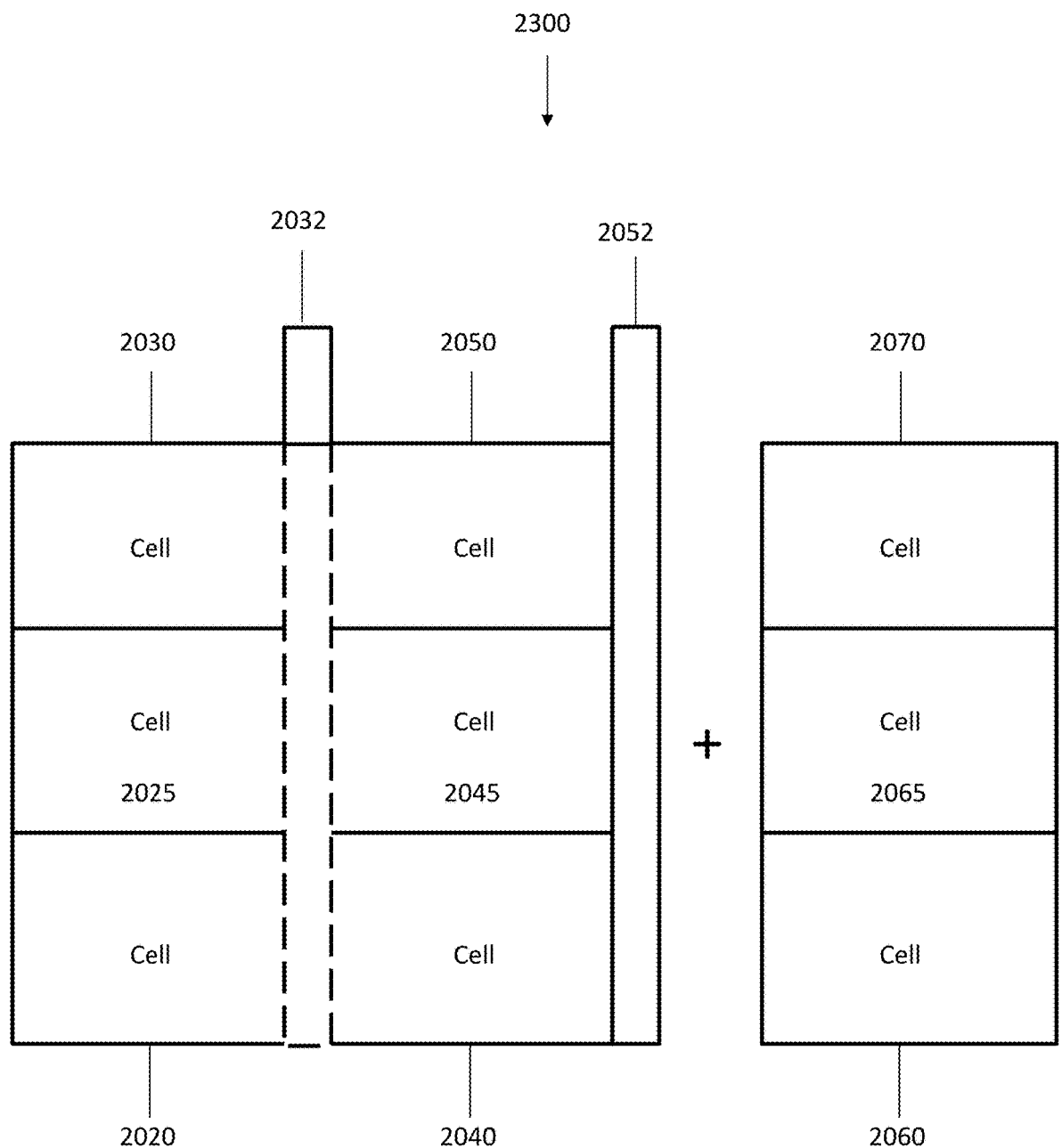
FIG. 15 illustrates an exemplary process involving additional interconnection componentry material and bonding a further set of photovoltaic cells according to embodiments of the present disclosure.

Referring now also to FIGS. 13, 14, and 15, an exemplary process including a step 2100 including placing interconnection componentry material on an edge of parallel photovoltaic sub-cells 2020, 2025, 2030 according to embodiments of the present disclosure is shown. Illustratively, the process step 2100 may include securing the conductive interconnection component 2032 at an edge or end of the photovoltaic sub-cells 2020, 2025, 2030, as shown in FIG. 13. In certain embodiments, the end or edge of the photovoltaic sub-cells 2020, 2025, 2030 may include a positive or negative terminal. For example, for illustration purposes the photovoltaic sub-cells 2020, 2025, 2030 may be secured to the interconnection component 2032 via the negative terminals of the photovoltaic sub-cells 2020, 2025, 2030. At step 2200, as shown in FIG. 14, the exemplary process may include incorporating a plurality of additional photovoltaic sub-cells 2040, 2045, 2050, which may be aligned (e.g., horizontally from a top perspective) with photovoltaic sub-cells 2020, 2025, 2030. The photovoltaic sub-cells 2040, 2045, 2050 may be secured to the interconnection component 2032 as well. For example, the positive terminals (or negative terminals depending on implementation) of the photovoltaic sub-cells 2040, 2045, 2050 may be secured to the interconnection component 2032.

In certain embodiments, the interconnection component 2032 may reside between the group of photovoltaic sub-cells 2020, 2025, 2030 and the group of photovoltaic sub-cells 2040, 2045, 2050. In certain embodiments, the group of photovoltaic sub-cells 2020, 2025, 2030 may be positioned higher (or lower depending on implementation) than the photovoltaic sub-cells 2040, 2045, 2050 with the interconnection component 2032 residing in between and connecting the sub-cells 2020, 2025, 2030, 2040, 2045, 2050 together. At step 2300, as shown in FIG. 15, the process may include the steps 2100, 2200 may be repeated until the photovoltaic cells in series achieves the desired voltage and/or the photovoltaic module achieves the desired power. For example, in FIG. 15, at step 2300, may include securing an additional interconnection component 2052 to the photovoltaic sub-cells 2040, 2045, 2050. Once the additional interconnection component 2052 is secured, such as to terminals of the photovoltaic sub-cells 2040, 2045, 2050, another group of photovoltaic sub-cells 2060, 2065, 2070 may be secured to the additional interconnection component 2052 to create a larger set of photovoltaic cells for a photovoltaic module.

Figure 16:
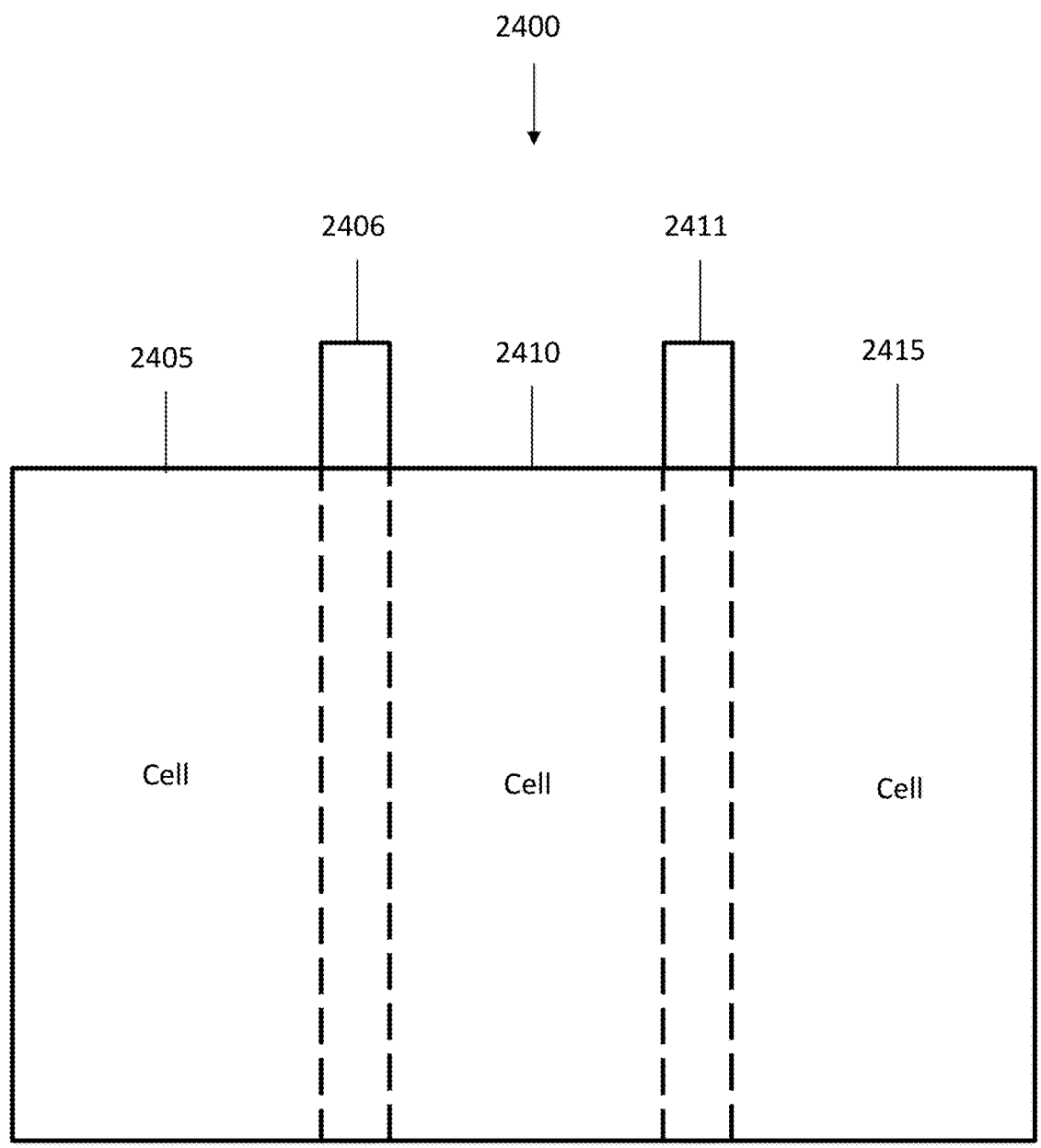
FIG. 16 illustrates exemplary interconnection of photovoltaic cells of photovoltaic substrings of a photovoltaic module or shingle according to embodiments of the present disclosure.
Figure 17:
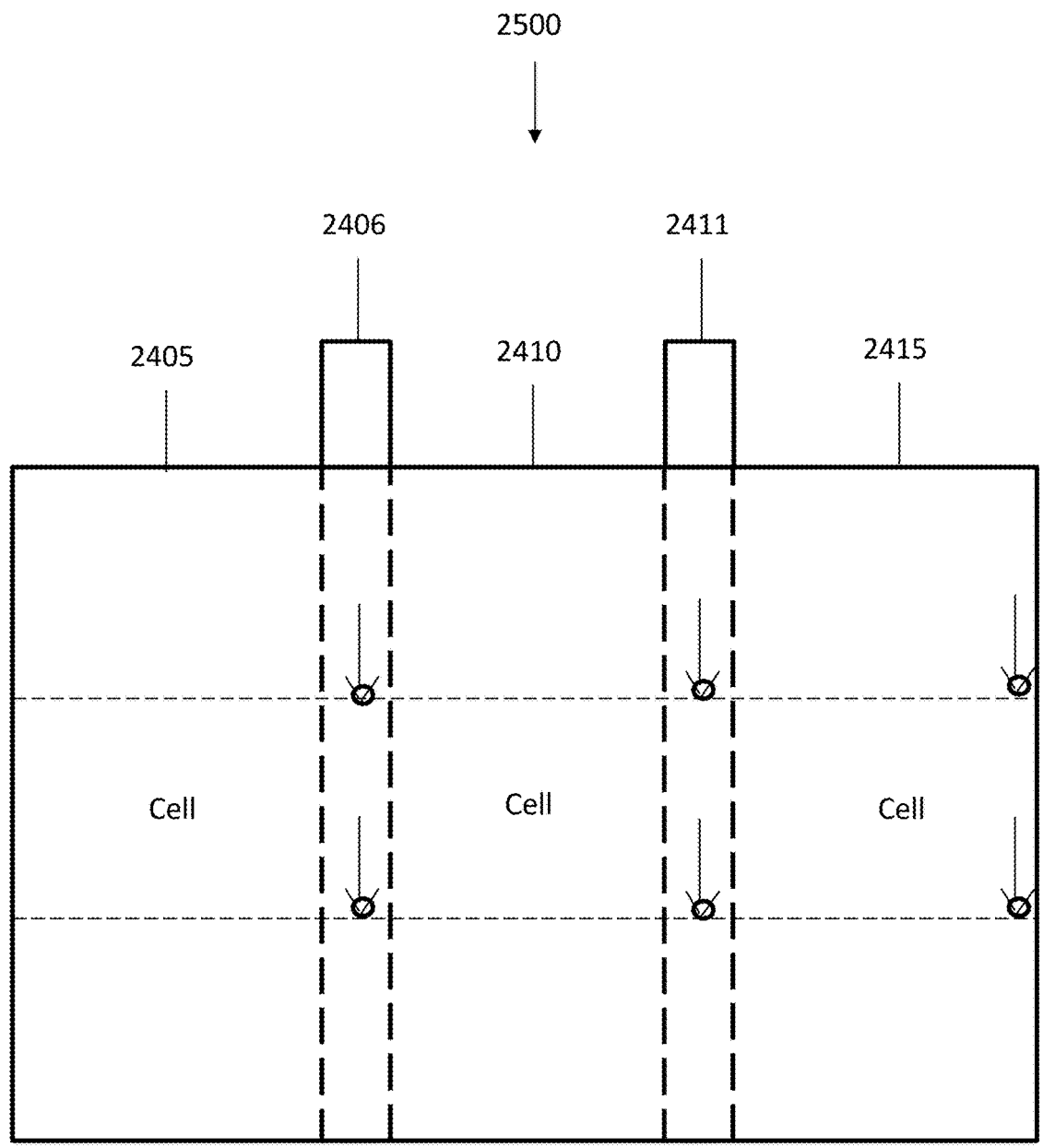
FIG. 17 illustrates an exemplary laser separation process utilized to separate large photovoltaic cells into sub-cells according to embodiments of the present disclosure.
Figure 18:
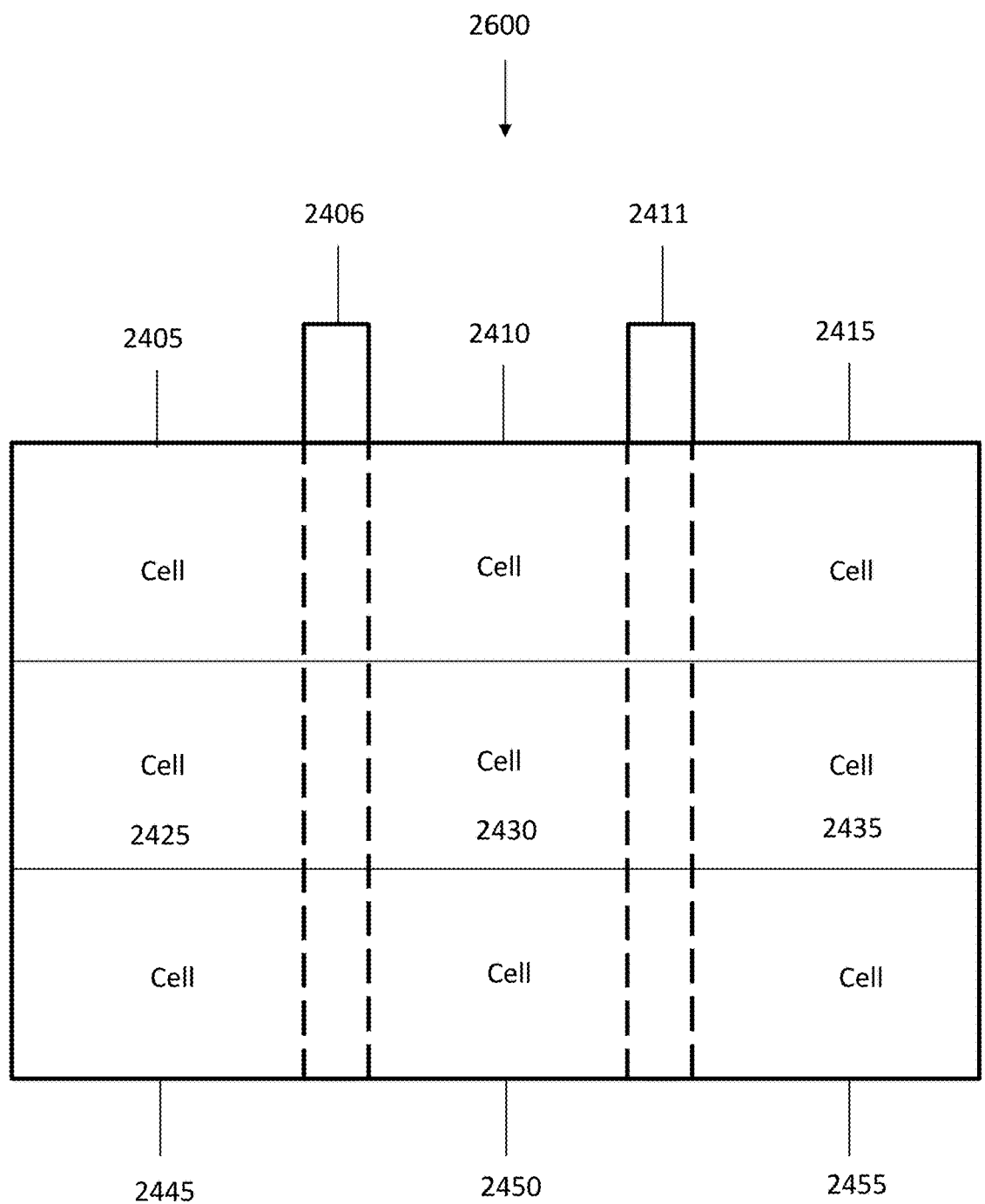
FIG. 18 illustrates an exemplary set of photovoltaic substrings interconnected using interconnection componentry according to embodiments of the present disclosure.

Referring now also to FIGS. 16, 17, and 18, exemplary process providing interconnection of photovoltaic cells of photovoltaic substrings of a photovoltaic module or shingle according to embodiments of the present disclosure is shown. In certain embodiments, the number of steps for the process shown in FIGS. 16, 17, and 18 may be fewer than for the process shown in FIGS. 13, 14, and 15 because the laser separation of the photovoltaic cells 2405, 2410, 2415 may be conducted after the photovoltaic cells 2405, 2410, 2415 are interconnected using interconnection components 2406, 2411. At step 2400, for example, a plurality of photovoltaic cells 2405, 2410, 2415, may be initially secured to interconnection components 2406, 2411, as shown in FIG. 16. Then, at step 2500, as shown in FIG. 17, the laser separation process may be conducted on each of the photovoltaic cells 2405, 2410, 2415 to create enough photovoltaic sub-cells to achieve a desired shade tolerance, among any other desired criteria (e.g., power output, power yield reduction goal, etc.). At 2600, as shown in FIG. 18, the process result is shown, which illustrates the creation of the photovoltaic sub-cells 2405, 2425, 2445, 2410, 2430, 2450, 2415, 2435, and 2455 for the photovoltaic module.

Figure 19:
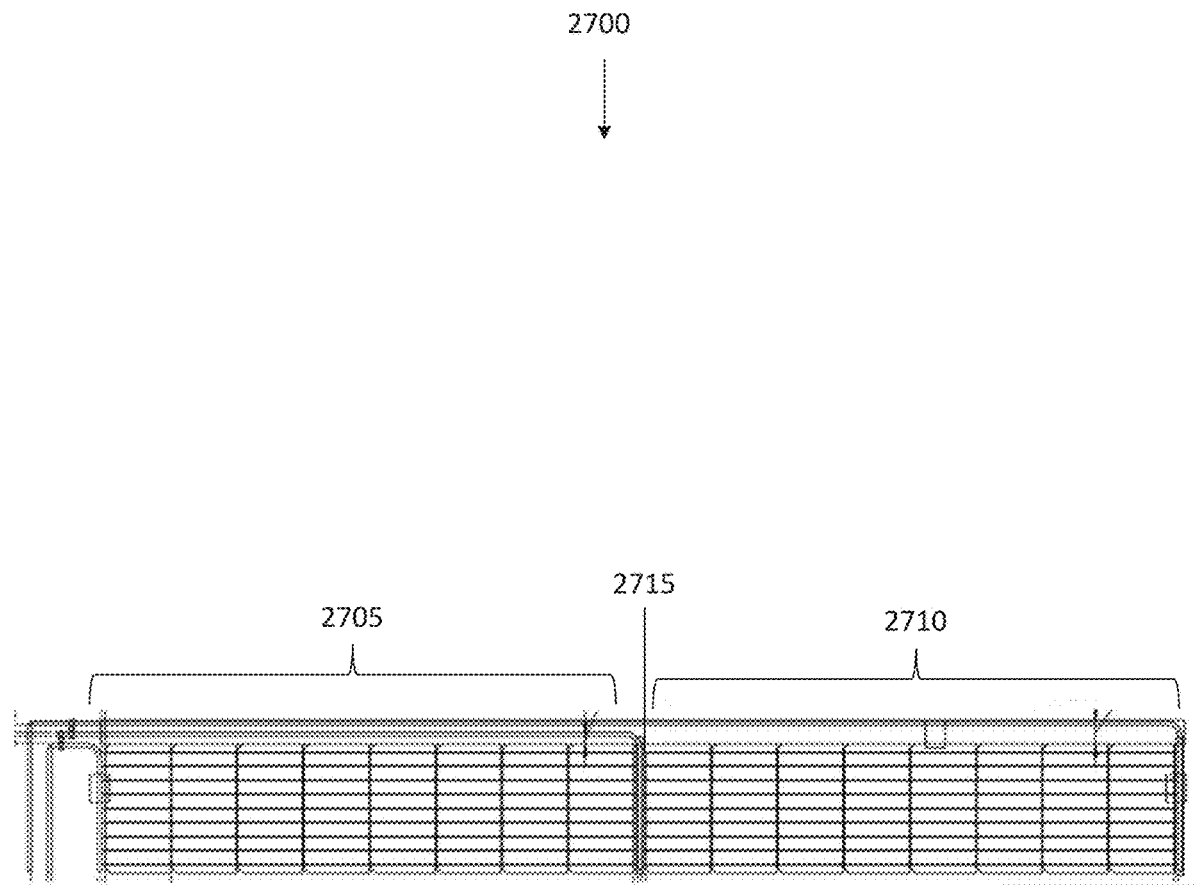
FIG. 19 illustrates a design of an existing photovoltaic circuit design incorporating a pair of photovoltaic substrings.
Figure 20:
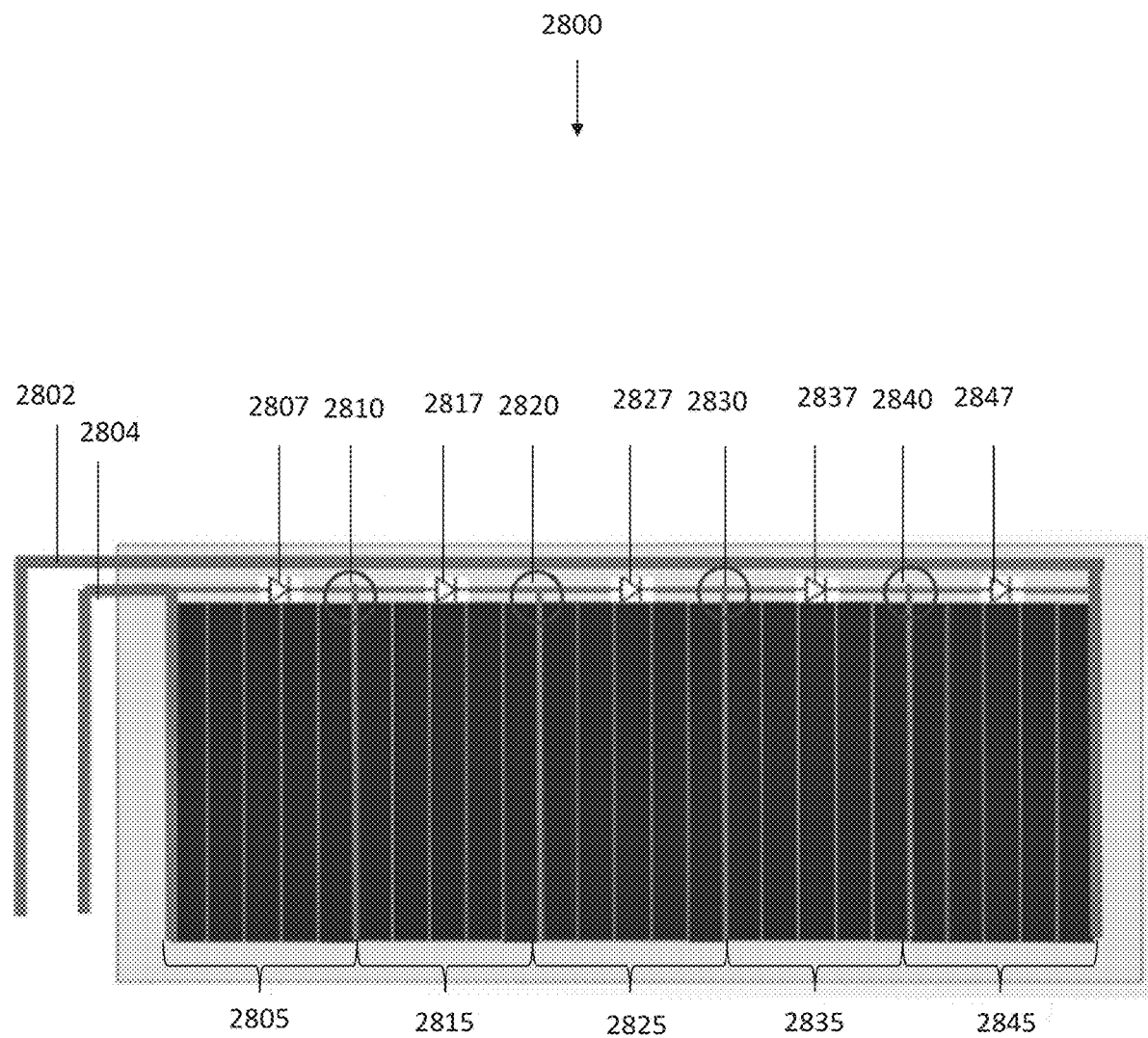
FIG. 20 illustrates an exemplary photovoltaic electrical circuit connected to photovoltaic substrings including cells connected via interconnection componentry according to embodiments of the present disclosure.

Referring now also to FIG. 19, an exemplary design of a photovoltaic circuit 2700 for use with a photovoltaic module incorporating a pair of photovoltaic substrings 2705, 2710 is shown. The photovoltaic circuit 2700 may include a bus-ribbon 2715 or other connecting component that connects the photovoltaic substrings 2705, 2710 together. The bus ribbon may occupy a certain amount of space of the photovoltaic module that could have been utilized for additional photovoltaic cells and/or other componentry. Referring now also to FIG. 20, an exemplary photovoltaic module or shingle 2800 including an electrical circuit 2804 connected to photovoltaic substrings 2805, 2815, 2825, 2835, 2845 including cells connected via interconnection componentry 2810, 2820, 2830, 2840 according to embodiments of the present disclosure is shown.

In certain embodiments, the interconnection componentry 2810, 2820, 2830, 2840 may enable other componentry to be connected to the electrical circuit 2804 of the photovoltaic modules or shingle 2800. For example, any number of bypass diodes 2807, 2817, 2827, 2837, and 2847 may be joined to the electrical circuit 2804. Each of the bypass diodes 2807, 2817, 2827, 2837, and 2847 may bypass the corresponding photovoltaic substrings 2805, 2815, 2825, 2835, 2845 to which they are attached. For example, bypass diode 2807 may bypass photovoltaic substring 2805 when the presence of a triggering condition is detected or occurs. The triggering condition, for example, may be shade made by an object or artifact, water intrusion, a weather event, a power surge, overheating or approaching a threshold temperature, a temperature rise, an electrical arc event, a moisture level, a voltage, an amperage, a wattage, a malfunction, a tampering event, a movement (e.g., of the modules or movement of an object in a vicinity of the module or shingle), a light change, a sound (e.g., a sound of thunder or other sound indicative of potential or actual hazardous conditions), any type of triggering condition, or any combination thereof.

Figure 21:
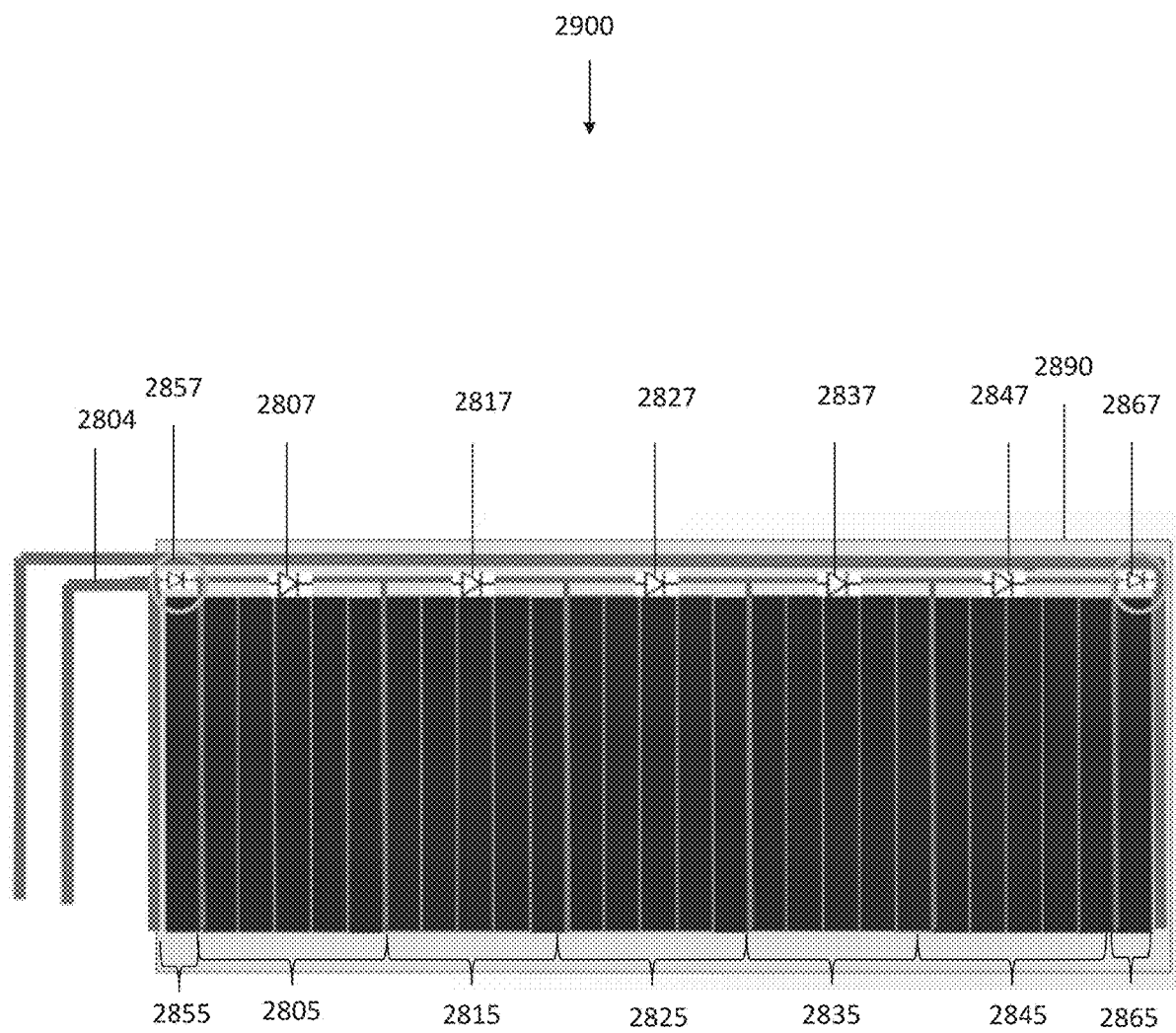
FIG. 21 illustrates the exemplary photovoltaic electrical circuit and substrings including cells connected via interconnection componentry of FIG. 28 incorporating bypass diodes according to embodiments of the present disclosure.
Figure 28:
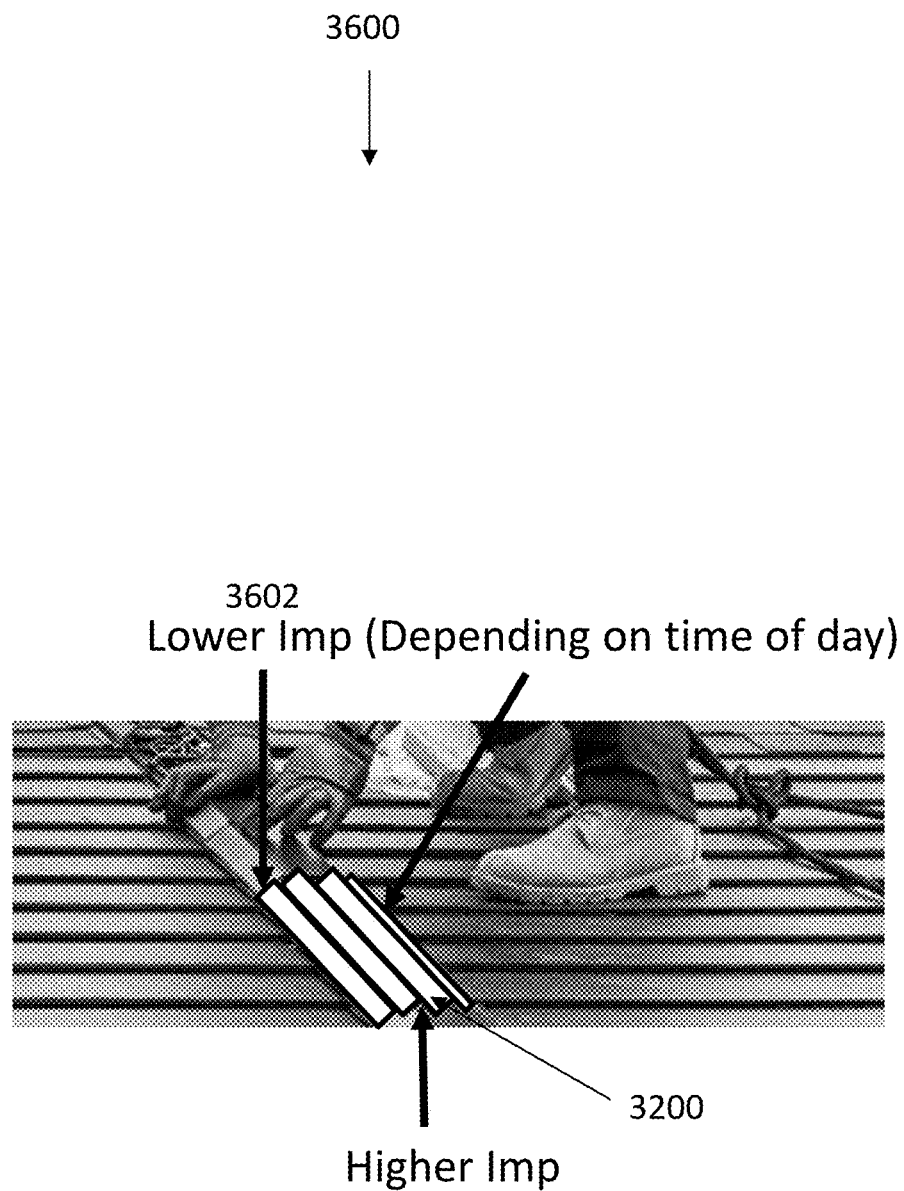
FIG. 28 illustrates an exemplary set of photovoltaic substrings positioned over a wireway according to embodiments of the present disclosure.

Referring now also to FIG. 21, an exemplary enhanced photovoltaic module or shingle 2900 including a photovoltaic electrical circuit 2804 and photovoltaic substrings including cells connected via interconnection componentry 2810, 2820, 2830, 2840 of FIG. 28 incorporating bypass diodes 2857, 2807, 2817, 2827, 2837, 2847, 2867 according to embodiments of the present disclosure is shown. In certain embodiments, the photovoltaic module or shingle 2900 may be supported via support structure 2890, which may be glass or other material. In certain embodiments, the interconnection componentry 2810, 2820, 2830, 2840 may enable additional bypass diodes 2857 and 2867 to be included in the electrical circuit 2804, and which may bypass corresponding photovoltaic substrings 2855 and 2865 respectively, which in FIG. 21, each include a single photovoltaic cell. As a result, the photovoltaic module or shingle 2900 of FIG. 21 includes greater photovoltaic cell coverage than photovoltaic module or shingle 2800, greater energy/power yield reduction, along with greater shade tolerance.

Figure 22:
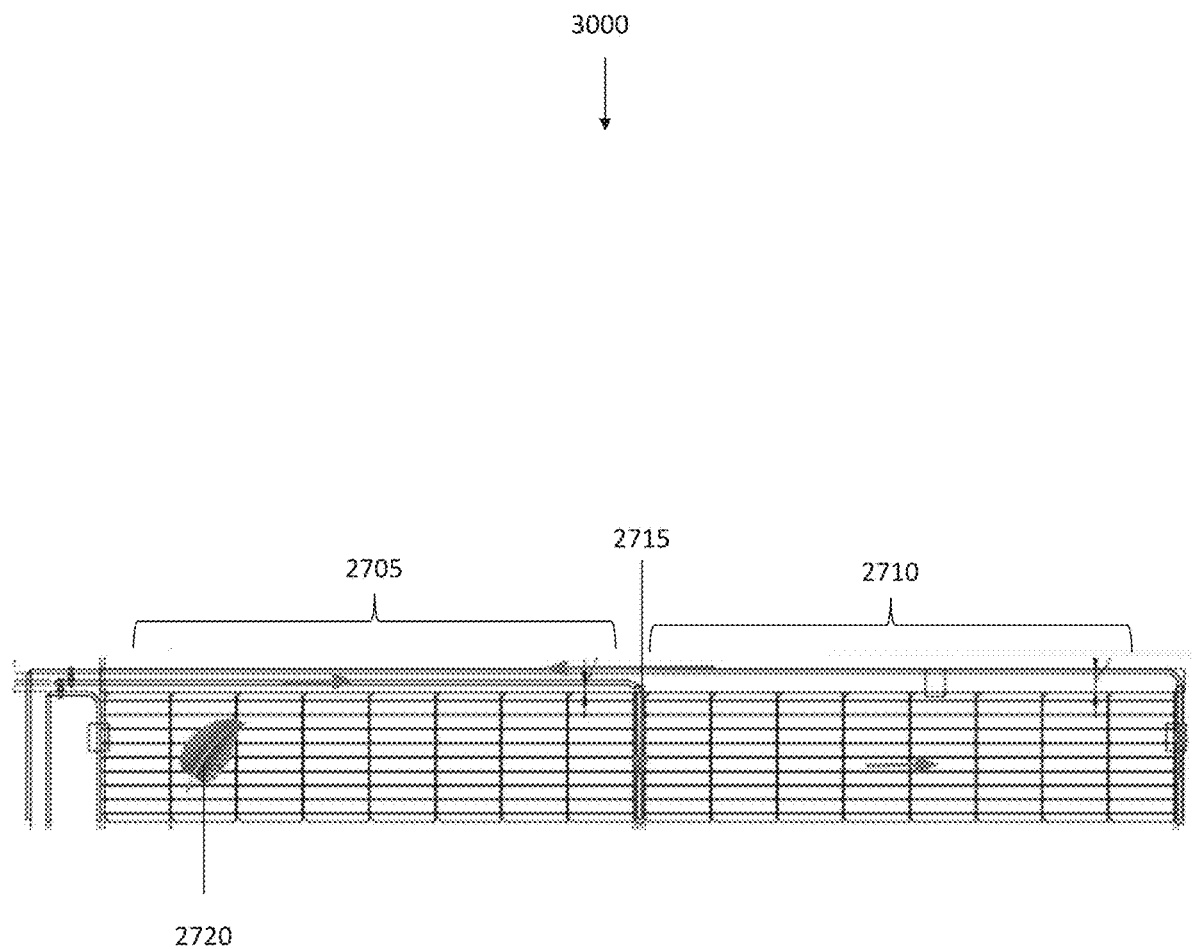
FIG. 22 illustrates an existing photovoltaic circuit design affected by an artifact.
Figure 23:
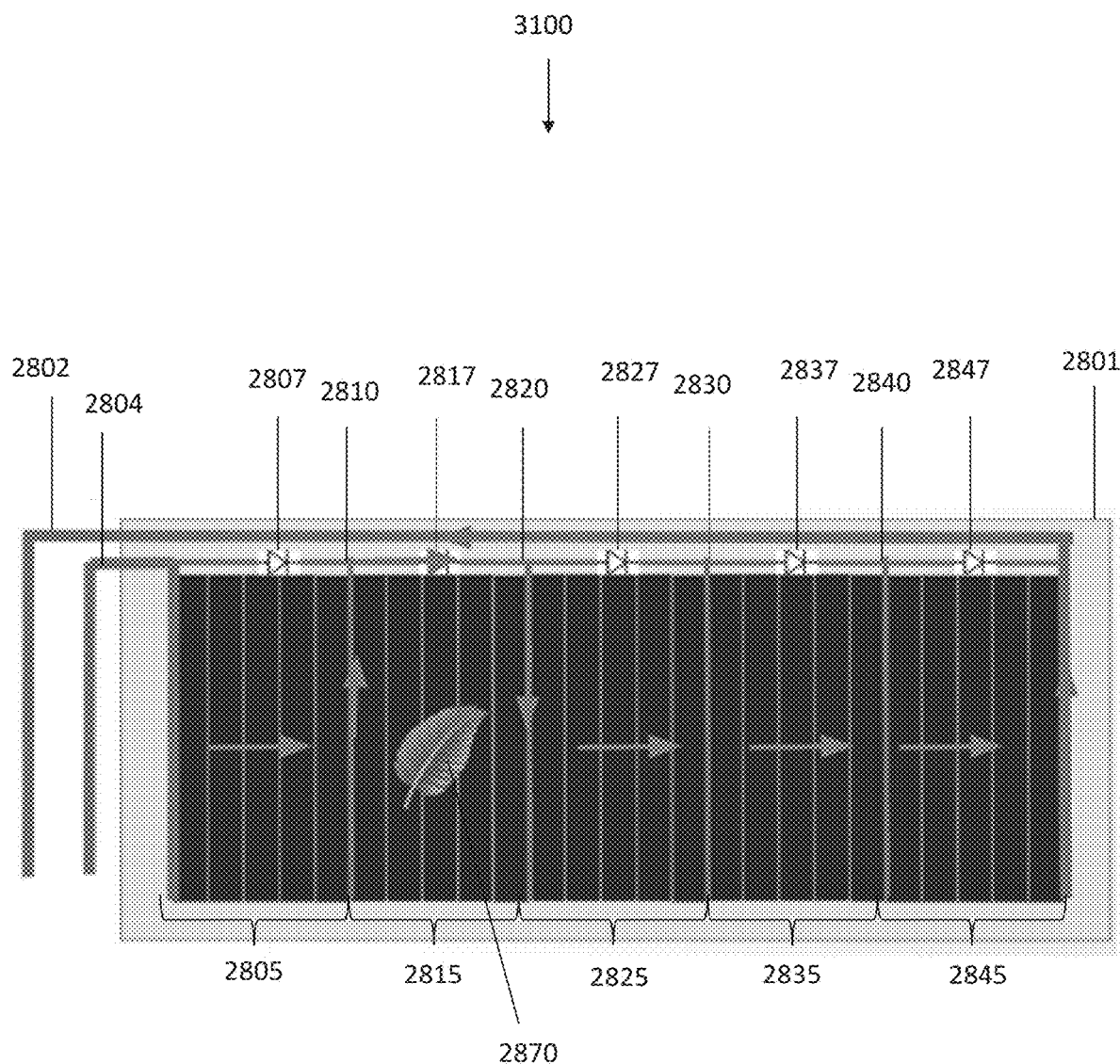
FIG. 23 illustrates an exemplary photovoltaic circuit design providing enhanced performance when affected by an artifact according to embodiments of the present disclosure.

Referring now also to FIG. 22, illustrates a design for a photovoltaic circuit 3000 affected by an artifact, such as a leaf 2720. The circuit 3000 includes a pair of photovoltaic substrings 2705 and 2710, which may be joined together using a bus-ribbon 2715. When the leaf 2720 falls onto the photovoltaic module, the entire photovoltaic substring 2705 will be bypassed using the design using photovoltaic circuit 3000. This results in a photovoltaic module that suffers a 50% energy/power yield reduction. Referring now also to FIG. 23, a design for an exemplary photovoltaic circuit 2804 of a photovoltaic module 3100 providing enhanced performance when affected by an artifact or object 2870, such as leaf, according to embodiments of the present disclosure, is shown. In certain embodiments, the circuit 2804 may include a plurality of photovoltaic substrings 2805, 2815, 2825, 2835, 2845 including a plurality of photovoltaic cells. The photovoltaic substrings 2805, 2815, 2825, 2835, 2845 may be connected to the electrical circuit 2804 via the extension portions of the interconnection componentry 2810, 2820, 2830, 2840 connecting the photovoltaic substrings 2805, 2815, 2825, 2835, 2845 together.

If, for example, an object 2870 (e.g., a leaf) falls on or casts a shadow or shade on the photovoltaic substring 2815, the corresponding bypass diode 2817 may be activated, which causes the photovoltaic substring 2815 to be bypassed by the electrical circuit 2804 until the shade or shadow is removed or no longer exists. In such a scenario, electrical current may flow through each of the remaining photovoltaic substrings 2805, 2825, 2835, 2845, as shown in FIG. 23. The current generated based on the absorbed sunlight by the photovoltaic substrings 2805, 2825, 2835, 2845 may be provided to any other componentry, such as via wire or conductive component 2802. Such other componentry may include optimizers, inverters, junction boxes, and the like.

Figure 24:
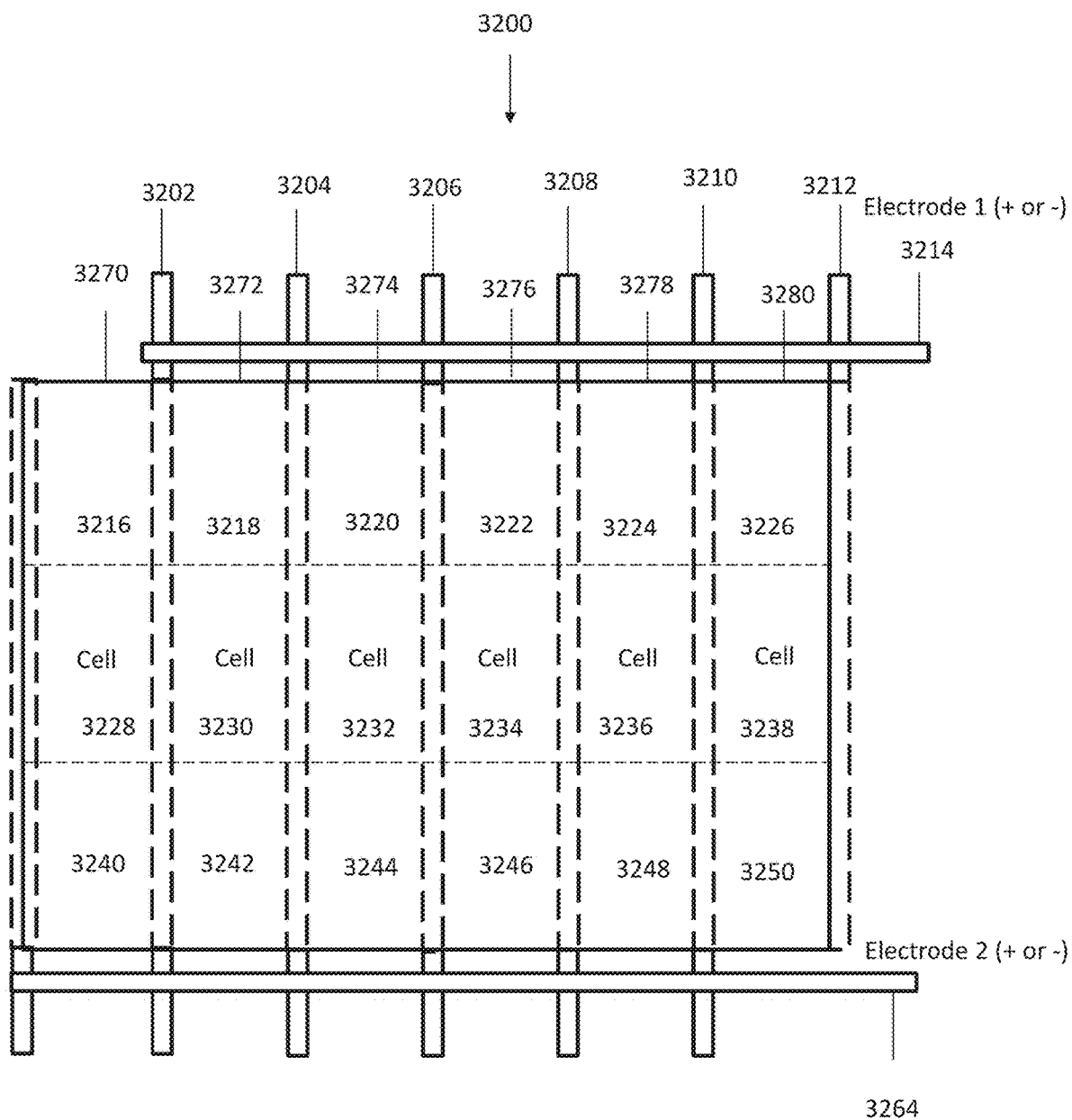
FIG. 24 illustrates an exemplary set of photovoltaic substrings interconnected using interconnection componentry capable of being utilized with non-planar surfaces according to embodiments of the present disclosure.
Figure 25:
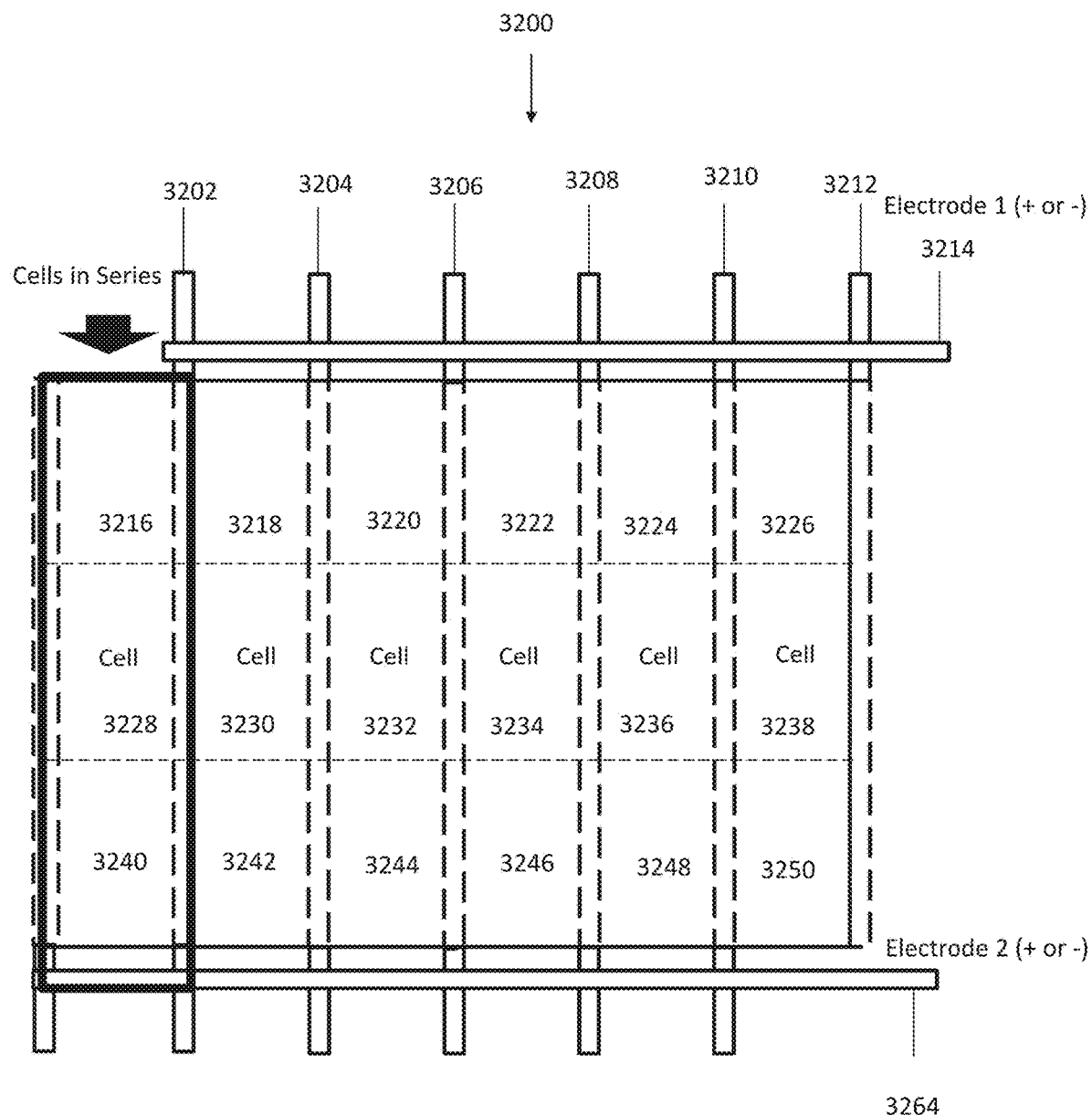
FIG. 25 illustrates an exemplary set of photovoltaic substrings including photovoltaic cells connected in series and interconnected using interconnection componentry capable of being utilized with non-planar surfaces according to embodiments of the present disclosure.
Figure 26:
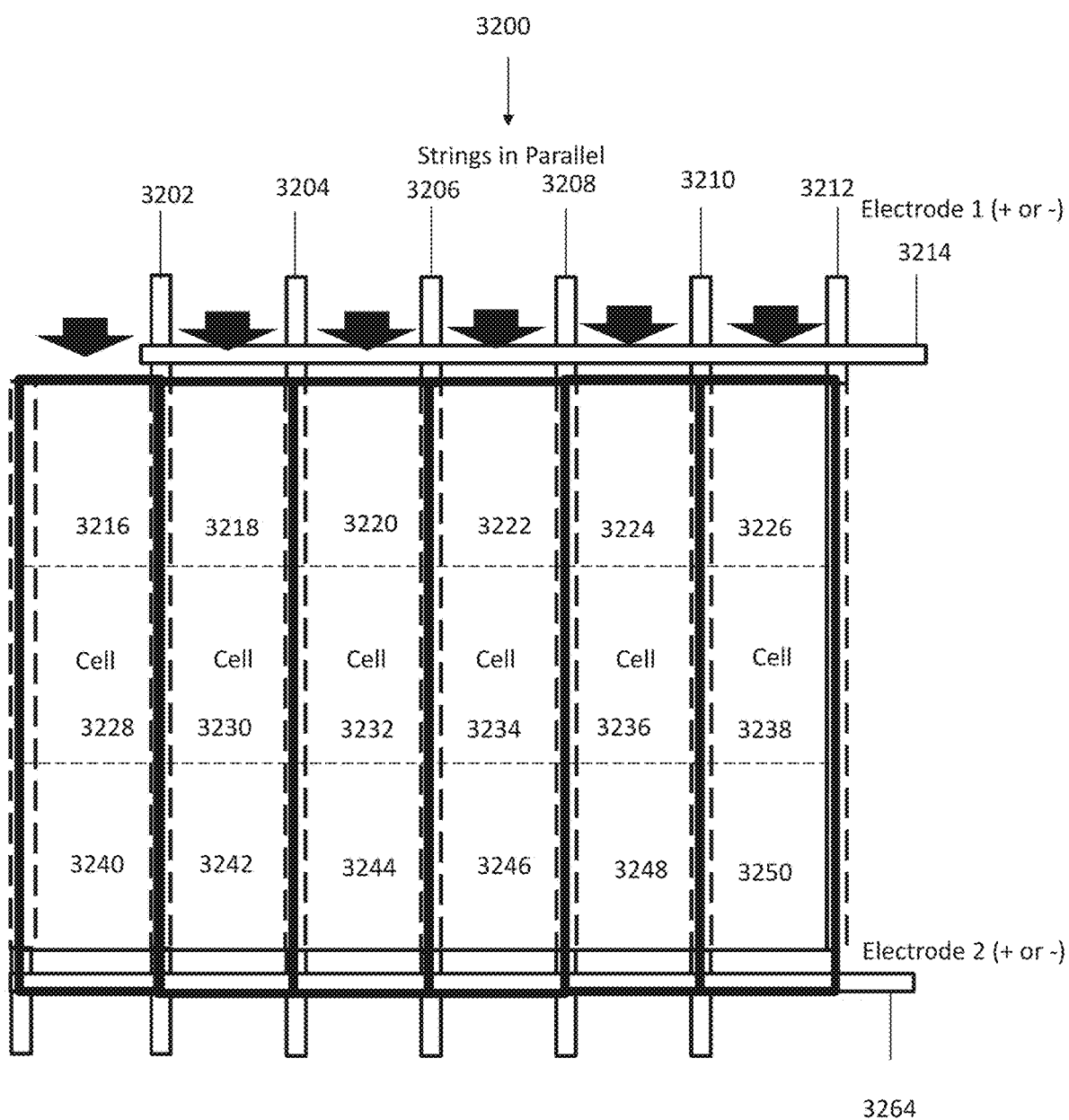
FIG. 26 illustrates an exemplary set of photovoltaic substrings connected in parallel and interconnected using interconnection componentry capable of being utilized with non-planar surfaces according to embodiments of the present disclosure.

Referring now also to FIGS. 24, 25, and 26, an exemplary photovoltaic module 3200 including a set of photovoltaic substrings 3270, 3272, 3274, 3276, 3278, 3280, 3282 interconnected using interconnection componentry 3202, 3204, 3206, 3208, 3210, 3212 capable of being utilized with non-planar surfaces according to embodiments of the present disclosure is shown. The interconnection componentry 3202, 3204, 3206, 3208, 3210, 3212 can be made of conductive material and can have any of the features, functionality, and/or capabilities as described for the other interconnection componentry described in the present disclosure. In certain embodiments, each of the photovoltaic substrings 3270, 3272, 3274, 3276, 3278, 3280, 3282, can be divided into a plurality of photovoltaic cells. For example, photovoltaic substring 3270 can be divided into photovoltaic cells 3216, 3228, 3240, photovoltaic substring 3272 can be divided into photovoltaic cells 3218, 3230, 3242, photovoltaic substring 3274 can be divided into photovoltaic cells 3220, 3232, 3244, photovoltaic substring 3276 can be divided into photovoltaic cells 3222, 3234, 3246, photovoltaic substring 3278 can be divided into photovoltaic cells 3224, 3236, 3248, and photovoltaic substring 3280 can be divided into photovoltaic cells 3226, 3238, 3250. In certain embodiments, each of the photovoltaic cells within a particular photovoltaic substring can be connected in series, as shown in FIG. 25. In certain embodiments, each of the photovoltaic substrings 3270, 3272, 3274, 3276, 3278, and 3280 can be connected in parallel with the photovoltaic substring adjacent to each photovoltaic substring, as shown in FIG. 26.

In certain embodiments, each of the interconnection components 3202, 3204, 3206, 3208, 3210, 3212 can connect a negative terminal of a photovoltaic cell (e.g., photovoltaic cell 3216) of a first substring to a positive terminal of a second photovoltaic cell (e.g., photovoltaic cell 3218) of a second substring to electrically connect the first and second photovoltaic cells of each of the photovoltaic substrings (e.g., photovoltaic substrings 3270, 3272). In certain embodiments, an extension portion of the interconnection component can extend beyond a first edge of the first photovoltaic cell of the first substring, a second edge of the second photovoltaic cell of the second substring, and/or edges of other photovoltaic cells of the photovoltaic module 3200. Similarly, additional extension portions of the interconnection components 3202, 3204, 3206, 3208, 3210, 3212 can extend beyond edges of other photovoltaic cells, such as photovoltaic cells 3240, 3242, 3244, 3246, 3248, and 3250. In certain embodiments, the extension portions can connect to at least one other substring of the plurality of photovoltaic substrings to electrically connect the first substring, the second substring, and the at least one other substring (e.g., photovoltaic substrings 3274, 3276, 3278, 3280) to the electrical circuit. In certain embodiments, the extension portions for each of the interconnection components 3202, 3204, 3206, 3208, 3210, 3212 can be connected to each other via electrodes 3214, 3264. In certain embodiments, the electrodes 3214, 3264 can be positive or negative. In certain embodiments, the electrodes 3214 and 3264 may be utilized to connect the photovoltaic module 3200 to other photovoltaic modules, photovoltaic substrings, electrical circuits, junction boxes, rapid shutdown systems, and/or any other components, wireways, and/or any other components. In certain embodiments, the electrodes 3214, 3264 can be rigid or flexible depending on implementation. For installations of the photovoltaic module 3200 on non-planar surfaces, such as curved roof tiles, one or more of the components of the photovoltaic module 3200 can be flexible, adjustable, or maneuverable such that the photovoltaic substrings 3270, 3272, 3274, 3276, 3278, 3280 can conform to the shape of the non-planar surface.

Referring now also to FIGS. 27 and 28, an exemplary set of photovoltaic substrings connected in parallel that are positioned on a non-planar curved roof surface according to embodiments of the present disclosure. FIGS. 27 and 28 illustrates how the photovoltaic module 3200 and/or other photovoltaic modules described in the present disclosure can be installed on non-planar surfaces, such as curved surfaces or irregular surfaces of tiles (e.g., tiles 3500), shingles, and/or other roof materials or components, such as wireways (e.g., wireway 3600). Curved surfaces, such as those found on Spanish-style roofs, or those found on wireway channels, such as those utilized to connect components of a photovoltaic system together, are often difficult to install photovoltaic modules on. Embodiments of the present disclosure, such as photovoltaic module 3200 that incorporates parallel photovoltaic substrings 3270, 3272, 3274, 3276, 3278, 3280 can be installed on a curved tile (e.g., as shown in FIG. 35) or wireway (e.g., as shown in FIG. 28). The use of the parallel photovoltaic substrings 3270, 3272, 3274, 3276, 3278, 3280 that can conform to the curved surfaces can enable maximized power generation with varying irradiance on the curved surfaces. For example, as shown in FIG. 27, the photovoltaic substrings 3270, 3272, 3274, 3276, 3278, 3280 each including their own corresponding photovoltaic cells enable circuit integration on such non-planar surfaces without risk of photovoltaic cell damage (e.g., cracking). Additionally, in certain embodiments, the parallel photovoltaic substrings 3270, 3272, 3274, 3276, 3278, 3280 enable no current limitation by lowest irradiance. In certain scenarios, there may be lower impedance for the photovoltaic substrings on flat or flatter surface and higher impedance for the photovoltaic substrings on the curved or irregular surfaces. In certain embodiments, the impedance may change depending on the time of day.

Figure 29:
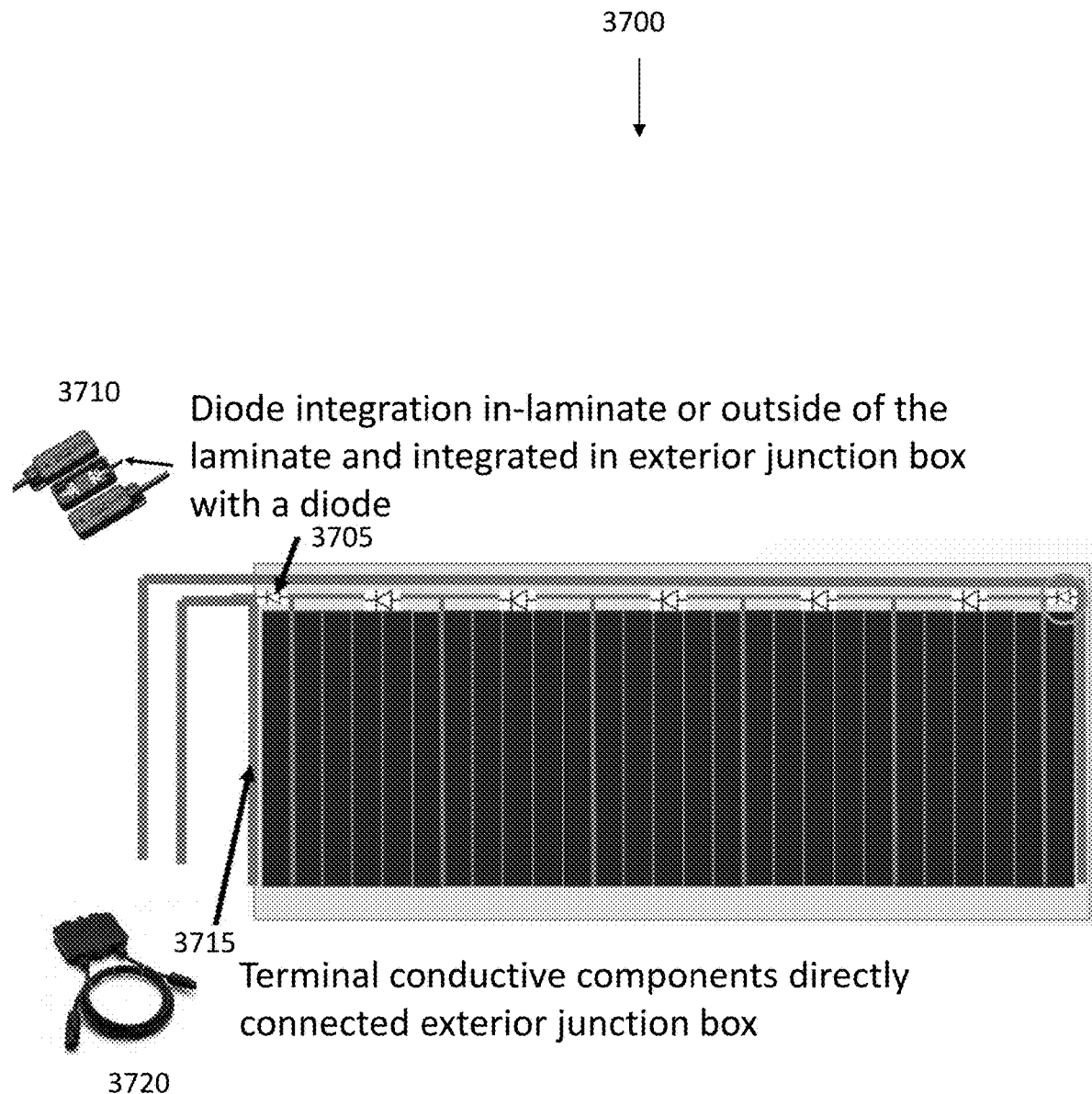
FIG. 29 illustrates an exemplary photovoltaic electrical circuit connected to photovoltaic substrings including cells connected via interconnection componentry and featuring interconnection of diode and conductive components to an external junction box according to embodiments of the present disclosure.

Referring now also to FIG. 29, an exemplary photovoltaic electrical circuit 3700 (e.g., of a photovoltaic module 3200) connected to photovoltaic substrings including cells connected via interconnection componentry and featuring interconnection of diode and conductive components to an external junction box according to embodiments of the present disclosure is shown. The electrical circuit 3700 can include any number of photovoltaic substrings and cells, which can be connected to each other via interconnection componentry that can connect with diodes 3705 (e.g., bypass diodes). In certain embodiments, the diodes 3705 can be integrated within the laminate of the photovoltaic module or the diodes 3705 (e.g., conductive portion) can be located outside of the laminate and integrated into an exterior junction box 3710, which can include the diode 3705. In certain embodiments, terminal conductive components 3715 can be connected directly to an external junction box 3720 as well.

Figure 30:
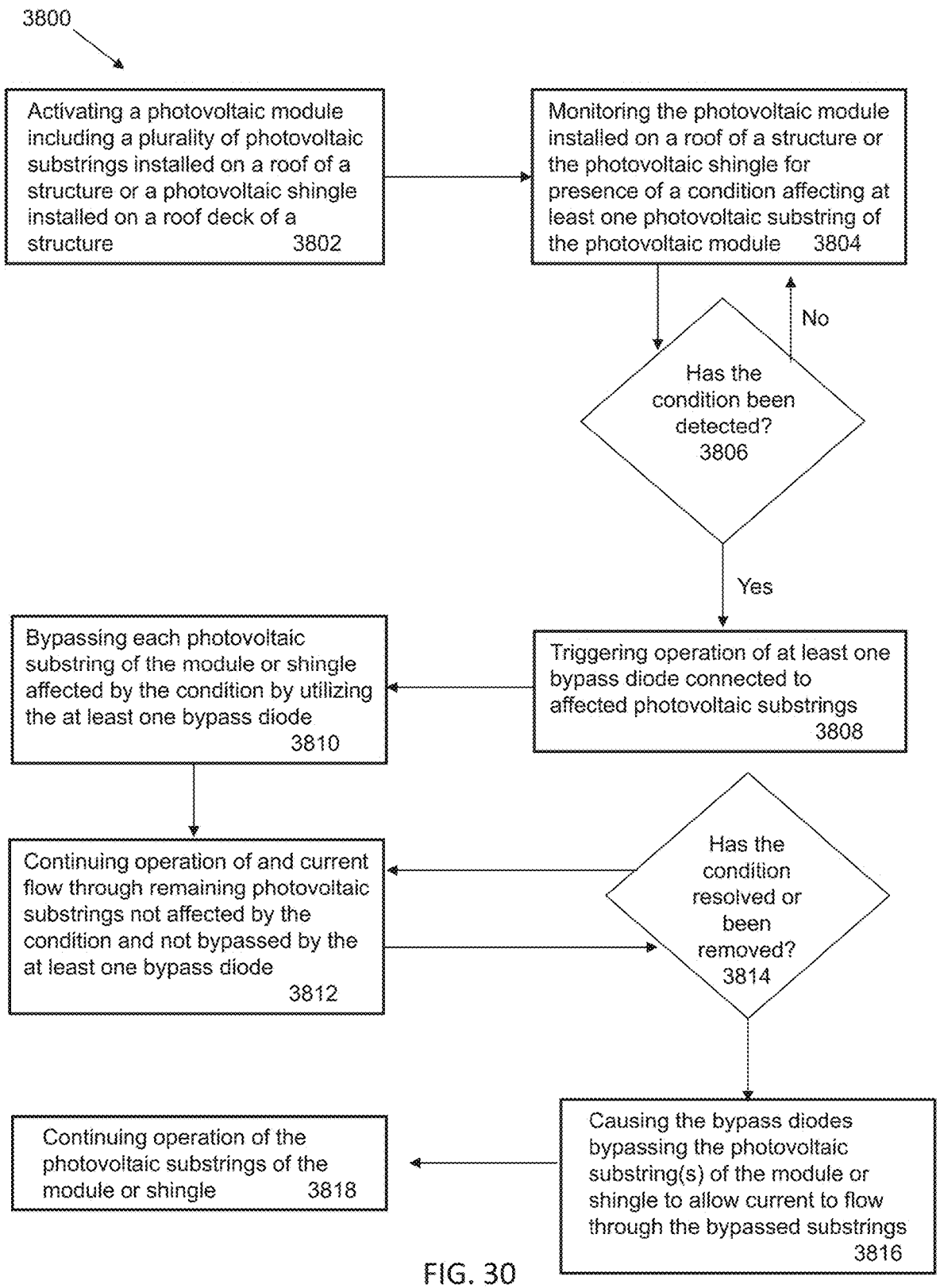
FIG. 30 illustrates and exemplary method relating to operation of a photovoltaic shingle or module featuring interconnection componentry according to embodiments of the present disclosure.

Referring now also to FIG. 30, an exemplary method 3800 relating to operation of a photovoltaic shingle or module featuring interconnection componentry according to embodiments of the present disclosure is illustrated. In certain embodiments, the method 3800 may utilize any of the interconnection componentry and/or any of the other componentry and devices of FIGS. 1-29 or as otherwise described herein to perform the operative functionality of the method 3800. In certain embodiments, the method 3800 provides steps for monitoring a photovoltaic module(s) installed on a roof of a structure or photovoltaic shingle(s) installed on a roof deck of the structure to detect the presence of conditions (e.g., hazards or other conditions) the may pose risk of damage to the roof, the structure, the photovoltaic modules or shingles, and to individuals that may be in a vicinity of the structure. Upon detection of the condition, the method 3800 may include bypassing affected photovoltaic substrings of the photovoltaic modules or shingles in an enhanced fashion.

At step 3802, the method 3800 may include activating a photovoltaic module or shingle including a plurality of photovoltaic substrings including photovoltaic cells installed on a roof of a structure (i.e., photovoltaic module embodiments) or installed on a roof deck of a structure (i.e., photovoltaic shingle embodiments). In certain embodiments, the activating may be conducted by turning on a switch or other input device connected to the module or shingle. At step 3804, the method 3800 may include monitoring the photovoltaic module or shingle for the presence of a condition (e.g., shade, object covering the module or shingle, malfunction of the module or shingle or substring, temperature, humidity, chemical, animal, object, etc.) affecting at least one photovoltaic substring of the photovoltaic module or shingle. In certain embodiments, the monitoring may be performed utilizing bypass diodes, however, in certain embodiments, the monitoring may be performed by utilizing one or more sensors associated with the photovoltaic module or shingle. For example, the sensors may be sensors of photovoltaic modules or shingles, sensors in proximity to the photovoltaic modules or shingles, sensors capable of sensing operating conditions associated with the photovoltaic strings of the modules or shingles, or any combination thereof. Such sensors may include, but are not limited to, motion sensors, light detection sensors, shade detection sensors, any other type of sensors, or a combination thereof.

At step 3806, the method 3800 may include determining whether the condition has been detected. If the condition has not been detected, the method 3800 may continue with step 3804 until a condition(s) is detected. If, however, the condition is detected, the method 3800 may proceed to step 3808, which may include triggering operation of at least one bypass diode connected to the photovoltaic substrings of the module or shingle that are affected by the condition. At step 3810, the method 3800 may include bypassing each photovoltaic substring of the module or shingle affected by the condition by utilizing the at least one bypass diode. In certain embodiments, bypassing the substring may prevent current from flowing through the bypassed substring to which the bypass diode is attached. At step 3812, the method 3800 may include continuing operation of each photovoltaic substring not affected by the condition so that current may flow through the remaining substrings (e.g., current resulting from absorption of sunlight by the module or shingle, or other current) and the module or shingle may continue to generate electricity in an optimized fashion.

At step 3814, the method 3800 may include determining whether the condition has resolved or been removed. If the condition has not been resolved or removed, the method 3800 may continue with step 3812 until the condition has been resolved or removed. If, however, the condition has been resolved or removed, the method 3800 may proceed to step 3816, which may include causing the bypass diodes bypassing the photovoltaic substrings of the module or shingle to re-allow the current to flow to the previously bypassed substrings. At step 3818, the method 3800 may include continuing operation of the photovoltaic substrings of the module or shingle until a further condition is detected, which may trigger operation of the method 3800 steps again.

In certain embodiments, the method 3800 may incorporate any of the other functionality, devices, and/or componentry described in the present disclosure and is not limited to the specific steps or sequence of steps illustrated in FIG. 30. The method 3800 may continually operate, operate at intervals, operate based on execution of commands or input devices, or any combination thereof. In certain embodiments, certain steps of the method 3800 may be removed and/or replaced with steps incorporating other functionality described in the present disclosure.

The illustrations of arrangements described herein are intended to provide a general understanding of the structure of various embodiments, and they are not intended to serve as a complete description of all the elements and features of devices and systems that might make use of the structures described herein. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure is not limited to the particular arrangement(s) disclosed as the best mode contemplated for carrying out this invention, but that the invention will include all embodiments and arrangements falling within the scope of the appended claims.

The foregoing is provided for purposes of illustrating, explaining, and describing embodiments of this invention. Modifications and adaptations to these embodiments will be apparent to those skilled in the art and may be made without departing from the scope or spirit of this invention. Upon reviewing the aforementioned embodiments, it would be evident to an artisan with ordinary skill in the art that said embodiments can be modified, reduced, or enhanced without departing from the scope and spirit of the claims described below.

The invention claimed is:

1. A system, comprising:
a plurality of photovoltaic modules,
wherein at least one photovoltaic module of the plurality of photovoltaic modules comprises:
an electrical circuit;
a plurality of photovoltaic substrings comprising a plurality of photovoltaic cells; and
at least one cell interconnection component comprising:
conductive material;
a first extension portion; and
a second extension portion;
wherein the at least one cell interconnection component directly connects a negative terminal at a first end of a first photovoltaic cell of a first substring of the plurality of photovoltaic substrings to a positive terminal at a second end of a second photovoltaic cell of a second substring of the plurality of photovoltaic substrings to electrically connect the first and second photovoltaic cells, wherein, the at least one cell interconnection component is positioned such that the at least one cell interconnection component stacks the first and second photovoltaic cells with respect to each other and a portion of the first and second ends of the first and second photovoltaic cells overlap where the at least one interconnection component is connected;
wherein the first extension portion of the at least one cell interconnection component extends beyond a first edge of the first photovoltaic cell of the first substring, a second edge of the second photovoltaic cell of the second substring, or a combination thereof; and
wherein the first extension portion is connected via a first electrode to at least one other first extension portion of at least one other substring of the plurality of photovoltaic substrings to electrically connect the first substring, the second substring, and the at least one other substring to the electrical circuit, wherein the first electrode is positioned beyond the first edge of the first photovoltaic cell of the first substring, the second edge of the second photovoltaic cell of the second substring, or a combination thereof; and
wherein the second extension portion extends beyond a bottom edge of a last photovoltaic cell of the first substring and is connected via a second electrode to at least one other second extension portion of the at least one other substring.

2. The system of claim 1, further comprising at least one bypass diode, wherein the at least one bypass diode bypasses only the first substring of the plurality of photovoltaic substrings in response to detection of a condition affecting the first substring of the plurality of photovoltaic substrings.

3. The system of claim 1, further comprising an end substring of the plurality of photovoltaic substrings located at an end of the at least one photovoltaic module, wherein the end substring comprises:
a single photovoltaic cell; and
a bypass diode, wherein the bypass diode bypasses only the single photovoltaic cell of the end substring upon detection of a condition affecting the end substring.

4. The system of claim 1, wherein the conductive material of the at least one cell interconnection component comprises laser-welded aluminum foil.

5. The system of claim 1, wherein the at least one cell interconnection component comprises an aluminum-aluminum weld, rear laser metal bond, an aluminum-gold weld, a front laser metal bond, or a combination thereof.

6. The system of claim 1, wherein each substring of the plurality of photovoltaic substrings is connected to at least one other substring of the plurality of photovoltaic substrings via the at least one cell interconnection component.

7. The system of claim 1, wherein a cell interconnection component of the at least one cell interconnection component containing the first extension portion is located at every nth photovoltaic cell of the plurality of photovoltaic cells of the plurality of photovoltaic substrings.

8. The system of claim 1, wherein a set of the plurality of photovoltaic cells is connected in parallel via the at least one cell interconnection component.

9. The system of claim 1, wherein the first photovoltaic cell and the second photovoltaic cell are connected in series via the at least one cell interconnection component.

10. The system of claim 1, wherein the electrical circuit comprises a bypass diode, an optimizer, a junction box, or a combination thereof.

11. The system of claim 1, further comprising:
a first layer, and
a second layer, wherein the first layer is a lowermost layer of the at least one photovoltaic module, wherein the second layer comprises the electrical circuit, the plurality of photovoltaic substrings comprising the plurality of photovoltaic cells, the at least one cell interconnection component, or a combination thereof.

12. The system of claim 1, wherein the at least one photovoltaic module is installed on a roof deck of a structure.

13. The system of claim 1, wherein at least a portion of the plurality of photovoltaic cells are each separated into a plurality of sub-cells.

14. The system of claim 13, wherein the portion of the plurality of photovoltaic cells provide a designated shade tolerance for the at least one photovoltaic module.

15. The system of claim 1, wherein at least a portion of the plurality of photovoltaic cells are connected via the at least one cell interconnection component in series to obtain a designated voltage, power, or a combination thereof.

16. A photovoltaic module, comprising:
an electrical circuit;
a plurality of photovoltaic substrings comprising a plurality of photovoltaic cells; and
at least one cell interconnection component comprising:
conductive material;
a first extension portion; and
a second extension portion;
wherein the at least one cell interconnection component directly connects a negative terminal at a first end of a first photovoltaic cell of a first substring of the plurality of photovoltaic substrings to a positive terminal at a second end of a second photovoltaic cell of a second substring of the plurality of photovoltaic substrings in a same row with the first substring to electrically connect the first and second photovoltaic cells, wherein, the at least one cell interconnection component is positioned such that the at least one cell interconnection component stacks the first and second photovoltaic cells with respect to each other and a portion of the first and second ends of the first and second photovoltaic cells overlap where the at least one interconnection component is connected, thereby causing the first and second substrings in the same row to have a contiguous configuration;

wherein the first extension portion of the at least one cell interconnection component extends beyond a first edge of the first photovoltaic cell of the first substring, a second edge of the second photovoltaic cell of the second substring, or a combination thereof; and wherein the first extension portion is connected via a first electrode to at least one other first extension portion of at least one other substring of the plurality of photovoltaic substrings to electrically connect the first substring, the second substring, and the at least one other substring to the electrical circuit, wherein the first electrode is positioned beyond the first edge of the first photovoltaic cell of the first substring, the second edge of the second photovoltaic cell of the second substring, or a combination thereof; and wherein the second extension portion extends beyond a bottom edge of a last photovoltaic cell of the first substring and is connected via a second electrode to at least one other second extension portion of the at least one other substring.

17. The photovoltaic module of claim 16, wherein the first extension portion is soldered to the electrical circuit to electrically connect the first extension portion to the electrical circuit, the first substring, the second substring, the at least one other substring, or a combination thereof.

* * * * *